(12) United States Patent
Silverbrook

(10) Patent No.: US 6,848,780 B2
(45) Date of Patent: Feb. 1, 2005

(54) PRINTING MECHANISM FOR A WIDE FORMAT PAGEWIDTH INKJET PRINTER

(75) Inventor: Kia Silverbrook, Balmain (AU)

(73) Assignee: Sivlerbrook Research Pty LTD, Balmain (AU)

(*) Notice: Subject to any disclaimer, the term of this patent is extended or adjusted under 35 U.S.C. 154(b) by 0 days.

(21) Appl. No.: 10/753,479

(22) Filed: Jan. 9, 2004

(65) Prior Publication Data

US 2004/0165034 A1 Aug. 26, 2004

Related U.S. Application Data

(63) Continuation of application No. 10/120,351, filed on Apr. 12, 2002, now Pat. No. 6,672,706, which is a continuation-in-part of application No. 09/112,767, filed on Jul. 10, 1998, now Pat. No. 6,416,167.

(30) Foreign Application Priority Data

Jul. 15, 1997 (AU) .............................................. PO7991
Mar. 25, 1998 (AU) .............................................. PO2592

(51) Int. Cl.[7] ................................................. B41J 2/01
(52) U.S. Cl. .................................................... 347/104
(58) Field of Search ............................. 347/12, 13, 20, 347/40, 42, 49, 56, 104; 400/642, 584–585; 399/377, 379; 271/9.02, 9.04; 101/477

(56) References Cited

U.S. PATENT DOCUMENTS

| | | |
|---|---|---|
| 4,423,401 A | 12/1983 | Mueller |
| 4,553,393 A | 11/1985 | Ruoff |
| 4,672,398 A | 6/1987 | Kuwabara et al. |
| 4,706,130 A | 11/1987 | Yamakawa |
| 4,737,802 A | 4/1988 | Mielke |
| 4,855,567 A | 8/1989 | Mueller |
| 4,864,824 A | 9/1989 | Gabriel et al. |

(List continued on next page.)

FOREIGN PATENT DOCUMENTS

DE 1 648 322 3/1971

(List continued on next page.)

OTHER PUBLICATIONS

*Noworolski, J. Mark et al, "Process for in–plane and out–of–plane single–crystal–silicon thermal microactuators". Sensors and Actuators, A, CH, Elsevier Sequoia S.A., Lausanne, vol. 55, No. 1, Jul. 15, 1996, pp 65–69, XP004077979 ISSN: 0924–4247.

(List continued on next page.)

*Primary Examiner*—K. Feggins
*Assistant Examiner*—An H. Do

(57) ABSTRACT

A printing mechanism includes a housing. A pair of spaced support members is positioned on either side of the housing. First and second primary rollers are mounted between the support members. A first platen is mounted between the support members and is positioned on one side of the rollers to define the print area. A second platen is mounted between the support members and is positioned on an opposite side of the rollers. The primary rollers and the platens define a print medium feed path that extends over an inner side of the second platen, the second primary roller, and an outer side of the first platen. The first and second primary rollers are configured to engage a length of print medium and to drive the print medium along the feed path on rotation of the primary rollers. A support assembly is mounted between the support members. A printhead assembly is positioned on the support assembly and includes an array of printhead chips that are positioned to span the print area. Each printhead chip incorporates a plurality of nozzle arrangements that are directed towards the first platen to carry out a printing operation on the print medium as it passes over the first platen.

5 Claims, 14 Drawing Sheets

U.S. PATENT DOCUMENTS

| | | | |
|---|---|---|---|
| 4,947,192 A | | 8/1990 | Hawkins et al. |
| 5,029,805 A | | 7/1991 | Albarda et al. |
| 5,057,854 A | | 10/1991 | Pond et al. |
| 5,107,276 A | | 4/1992 | Kneezel et al. |
| 5,160,945 A | | 11/1992 | Drake |
| 5,218,754 A | | 6/1993 | Rangappan |
| 5,258,774 A | | 11/1993 | Rogers |
| 5,412,410 A | | 5/1995 | Rezanka |
| 5,565,900 A | | 10/1996 | Cowger et al. |
| 5,666,141 A | | 9/1997 | Matoba et al. |
| 5,719,602 A | | 2/1998 | Hackleman et al. |
| 5,719,604 A | | 2/1998 | Inui et al. |
| 5,812,159 A | | 9/1998 | Anagnostopoulos et al. |
| 5,850,240 A | * | 12/1998 | Kubatzki et al. ............. 347/49 |
| 5,867,183 A | | 2/1999 | Cornell et al. |
| 5,896,155 A | | 4/1999 | Lebens et al. |
| 6,007,187 A | | 12/1999 | Kashino et al. |
| 6,068,367 A | * | 5/2000 | Fabbri .......................... 347/49 |
| 6,290,332 B1 | * | 9/2001 | Crystal et al. ................ 347/50 |
| 6,312,114 B1 | | 11/2001 | Silverbrook |
| 6,443,555 B1 | * | 9/2002 | Silverbrook et al. .......... 347/42 |

FOREIGN PATENT DOCUMENTS

| | | |
|---|---|---|
| DE | 29 05 063 | 8/1980 |
| DE | 32 45 283 | 6/1984 |
| DE | 34 30 155 | 2/1986 |
| DE | 37 16 996 | 12/1988 |
| DE | 39 34 280 | 4/1990 |
| DE | 43 28 433 | 3/1995 |
| DE | 195 16 997 | 11/1995 |
| DE | 195 17 969 | 11/1995 |
| DE | 195 32 913 | 3/1996 |
| DE | 196 23 620 | 12/1996 |
| DE | 196 39 717 | 4/1997 |
| EP | 0 092 229 | 10/1983 |
| EP | 0 398 031 | 11/1990 |
| EP | 0 427 291 | 5/1991 |
| EP | 0 431 338 | 6/1991 |
| EP | 0 478 956 | 4/1992 |
| EP | 0 506 232 | 9/1992 |
| EP | 0 510 648 | 10/1992 |
| EP | 0 627 314 | 12/1994 |
| EP | 0 634 273 | 1/1995 |
| EP | 0 713 774 | 5/1996 |
| EP | 0 737 580 | 10/1996 |
| EP | 0 750 993 | 1/1997 |
| EP | 0 842 777 B1 | 5/1998 |
| EP | 0 882 590 | 12/1998 |
| FR | 2 231 076 | 12/1974 |
| GB | 792 145 | 3/1958 |
| GB | 1 428 239 | 3/1976 |
| GB | 2 262 152 | 6/1993 |
| JP | 56-112747 | 7/1983 |
| JP | 58 116165 | 7/1983 |
| JP | 61 025849 | 2/1986 |
| JP | 61 268453 | 11/1986 |
| JP | 01 105746 | 4/1989 |
| JP | 01 115639 | 5/1989 |
| JP | 01 128839 | 5/1989 |
| JP | 01 257058 | 10/1989 |
| JP | 01 306254 | 12/1989 |
| JP | 02 050841 | 2/1990 |
| JP | 2-92643 | 4/1990 |
| JP | 2-108544 | 4/1990 |
| JP | 02 158348 | 6/1990 |
| JP | 02 162049 | 6/1990 |
| JP | 2-265752 | 10/1990 |
| JP | 03 653348 | 3/1991 |
| JP | 03 112662 | 5/1991 |
| JP | 03 180350 | 8/1991 |
| JP | 40400105 A | 1/1992 |
| JP | 04 118241 | 4/1992 |
| JP | 04 126255 | 4/1992 |
| JP | 04 141429 | 5/1992 |
| JP | 4-353458 | 12/1992 |
| JP | 04 368851 | 12/1992 |
| JP | 05 28765 | 10/1993 |
| JP | 05 318724 | 12/1993 |
| JP | 6-91865 | 4/1994 |
| JP | 6-91866 | 4/1994 |
| JP | 07 314665 | 12/1995 |
| WO | WO 94 18010 | 8/1994 |
| WO | WO 97 12689 | 4/1997 |
| WO | WO 01/42020 | 6/2001 |

OTHER PUBLICATIONS

*Ataka, Manabu et al, "Fabrication and Operation of Polymide Bimorph Actuators for Ciliary Motion System". Journal of Microelectromechanical Systems, US, IEEE Inc. New York, vol. 2, No. 4, Dec. 1, 1993, pp 146–150, XP000443412, ISSN: 1057–7157.

*Yamagata Yutaka et al, "A Micro Mobile Mechanism Using Thermal Expansion and its Theoretical Analysis". Proceeding of the workshop on micro electro mechanical systems (MEMS), US, New York, IEEE, vol. Workshop 7, Jan. 25, 1994, pp 142–147, XP000528408, ISBN: 0 7803 1834 X.

* cited by examiner

PRINTING MECHANISM FOR A WIDE FORMAT PAGEWIDTH INKJET PRINTER

This is a Continuation Application of U.S. Ser. No. 10/120,351 filed on Apr. 12, 2002, now U.S. Pat. No. 6,672,706, which is a continuation-in-part of appl. Ser. No. 09/112,767, filed Jul. 10, 1998, now U.S. Pat. No. 6,416,167.

STATEMENT REGARDING FEDERALLY SPONSORED RESEARCH OR DEVELOPMENT

Not Applicable

1. Field of the Invention

This invention relates to a wide format pagewidth inkjet printer. More particularly, this invention relates to an ink supply arrangement for a printing mechanism of a wide format pagewidth inkjet printer and to a wide format pagewidth inkjet printer.

2. Reference Patent Applications

This application is a continuation-in-part application of U.S. application Ser. No. 09/112,767, now U.S. Pat. No. 6,416,167. The following United States applications and patents are hereby incorporated by reference:

| | | | | |
|---|---|---|---|---|
| 6,227,652 | 6,213,588 | 6,213,589 | 6,231,163 | 6,247,795 |
| 6,394,581 | 6,244,691 | 6,257,704 | 6,416,168 | 6,220,694 |
| 6,257,705 | 6,247,794 | 6,234,610 | 6,247,793 | 6,264,306 |
| 6,241,342 | 6,247,792 | 6,264,307 | 6,254,220 | 6,234,611 |
| 6,302,528 | 6,283,582 | 6,239,821 | 6,338,547 | 6,247,796 |
| 6,390,603 | 6,362,843 | 6,293,653 | 6,312,107 | 6,227,653 |
| 6,234,609 | 6,238,040 | 6,188,415 | 6,227,654 | 6,209,989 |
| 6,247,791 | 6,336,710 | 6,217,153 | 6,416,167 | 6,243,113 |
| 6,583,281 | 6,247,790 | 6,260,953 | 6,267,469 | 6,273,544 |
| 6,309,048 | 6,420,196 | 6,443,558 | 6,439,689 | 6,378,989 |
| 6,406,129 | 6,505,916 | 6,457,809 | 6,457,812 | 6,428,133 |
| 6,362,868, | 6,443,555 | 09/422,893 | 09/113,122, now allowed | |
| 09/425,420, now abandoned | | 09/693,703, now allowed | 09/693,727, now abandoned | |

BACKGROUND OF THE INVENTION

High volume, high resolution printing is an objective that has been sought by the manufacturers of wide format printers for some time. Wide format printers have been available to the public for many years. Examples of popular wide format printers are the Hewlett Packard (HP) 1000/5000, the HP 3000/3500, the Epson 7000/10 000 and many others.

These printers all have a traversing printhead that traverses a print medium while depositing ink on the medium. Applicant believes that these printers suffer from inherent disadvantages, particularly when attempts are made to utilize the design of such printers in order to achieve faster printing speeds at high resolutions.

Central to the problem of achieving high printing speeds is the ability to achieve a printhead that is capable of generating the necessary number of ink dots at a suitable rate. Further, in order to achieve accurate printing, it is desirable that a row or band of the image be created in as little print cycles as possible, and preferably in a single print cycle. It follows that it is undesirable for a traversing printhead to be used in an attempt to achieve high print speeds and that a single printhead incorporating a suitable number of ink-jet nozzles is required.

Thermal printheads also referred to as bubble jet printheads and piezoelectric printheads have been available for some time. These suffer from excessive heat build up and energy consumption and have therefore been found by the applicant to not be suitable for use in a pagewidth configuration. A number of disadvantages associated with such printheads are set out in U.S. Pat. No. 6,443,555.

The applicant has developed a printhead chip that is capable of producing images having a resolution as high as 1600 dpi. These chips are manufactured using integrated circuit fabrication techniques. Details of the chips are provided in the above referenced applications and patents. Applicant believes that these printhead chips are extremely suitable for use in wide format printers. The reason for this is that such chips operate at extremely high speeds due to the large number of nozzle arrangements required in a single chip and due to the fact that such chips can be driven at an extremely high cyclical rate.

The Applicant has been faced with a number of difficulties in order to achieve the effective use of such printhead chips in wide format printers. One particular difficulty identified by the Applicant is the effective control of a number of such printhead chips to achieve accurate printing. This control must incorporate the use of effective image processing tools that are capable of processing stored images at a rate that corresponds with the physical rate of printing achievable by a number of the above printhead chips.

Another difficulty that faces the manufacturers of wide format printers are the problems associated with heat build up. This can often result in the necessity for expensive heat extraction devices that add to the complexity of the printer.

SUMMARY OF THE INVENTION

According to a first aspect of the invention, there is provided a printing mechanism that comprises a housing;

a pair of spaced support members that are positioned on either side of the housing;

first and second primary rollers that are mounted between the support members;

a first platen that is mounted between the support members and is positioned on one side of the rollers to define the print area;

a second platen that is mounted between the support members and is positioned on an opposite side of the rollers, the primary rollers and the platens defining a print medium feed path that extends over an inner side of the second platen, the second primary roller, and an outer side of the first platen, the first and second primary rollers being configured to engage a length of print medium and to drive the print medium along the feed path on rotation of the primary rollers;

a support assembly that is mounted between the support members; and a printhead assembly that is positioned on the support assembly and that includes an array of printhead chips that are positioned to span the print area, each printhead chip incorporating a plurality of nozzle arrangements that are directed towards the first platen to carry out a printing operation on the print medium as it passes over the first platen.

The primary rollers may be rotatable to drive the length of print medium successively over the inner surface of the second platen, the second primary roller and the outer surface of the first platen.

The support assembly may include a chassis and a channel member that is mounted on the chassis. The printhead assembly may include an ink distribution structure that is positioned in a channel defined by the channel member and the array of printhead chips, which are positioned on the ink distribution structure.

The chassis may be displaceable towards and away from the first platen. The support assembly may include a displacement mechanism that is operable to displace the chassis towards and away from the first platen.

A cutting mechanism may be mounted between the support members. The cutting mechanism may include a cutter that is displaceable with respect to the first platen to traverse the first platen thereby carrying out a cutting operation on the print medium.

A brush member may be mounted in the housing adjacent the second primary roller. The brush member may have a profile that corresponds to the second primary roller such that the print medium feed path extends between the brush member and the second primary roller.

According to a second aspect of the invention, there is provided a print assembly for a wide format pagewidth inkjet printer, the print assembly comprising an elongate carrier that is mountable on a support structure of the printer and is positioned an operative distance from a platen of the printer;

a number of printhead chips that are mounted on the carrier, the printhead chips being provided in a number and configuration such that the printhead chips define a printing zone between the carrier and the platen, the printing zone having a length of at least 36 inches (914 mm), each printhead chip being of the type that incorporates a plurality of nozzle arrangements, each nozzle arrangement being in the form of a micro electromechanical system to achieve the ejection of ink from the nozzle arrangement; and control circuitry that is positioned on the carrier and is operatively connected to the printhead chips to control operation of the printhead chips.

According to a third aspect of the invention, there is provided a wide format pagewidth inkjet printer that comprises a support structure;

a platen positioned in the support structure;

a print assembly positioned operatively with respect to the platen, the print assembly comprising an elongate carrier that is mounted on the support structure of the printer and is positioned an operative distance from the platen;

a number of printhead chips mounted on the carrier, the printhead chips being provided in a number and configuration such that the printhead chips define a printing zone between the carrier and the platen, the printing zone having a length of at least 36 inches (914 mm), each printhead chip being of the type that incorporates a plurality of nozzle arrangements, each nozzle arrangement being in the form of a micro electromechanical system to achieve the ejection of ink from the nozzle arrangement; and control circuitry that is positioned on the carrier and is operatively connected to the printhead chips to control operation of the printhead chips; and a feed mechanism that is positioned on the support structure for feeding a print medium though the printing zone.

The invention is now described, by way of example, with reference to the accompanying drawings. The following description is not intended to limit the broad scope of the above summary.

DETAILED DESCRIPTION OF THE INVENTION

Figure 4:
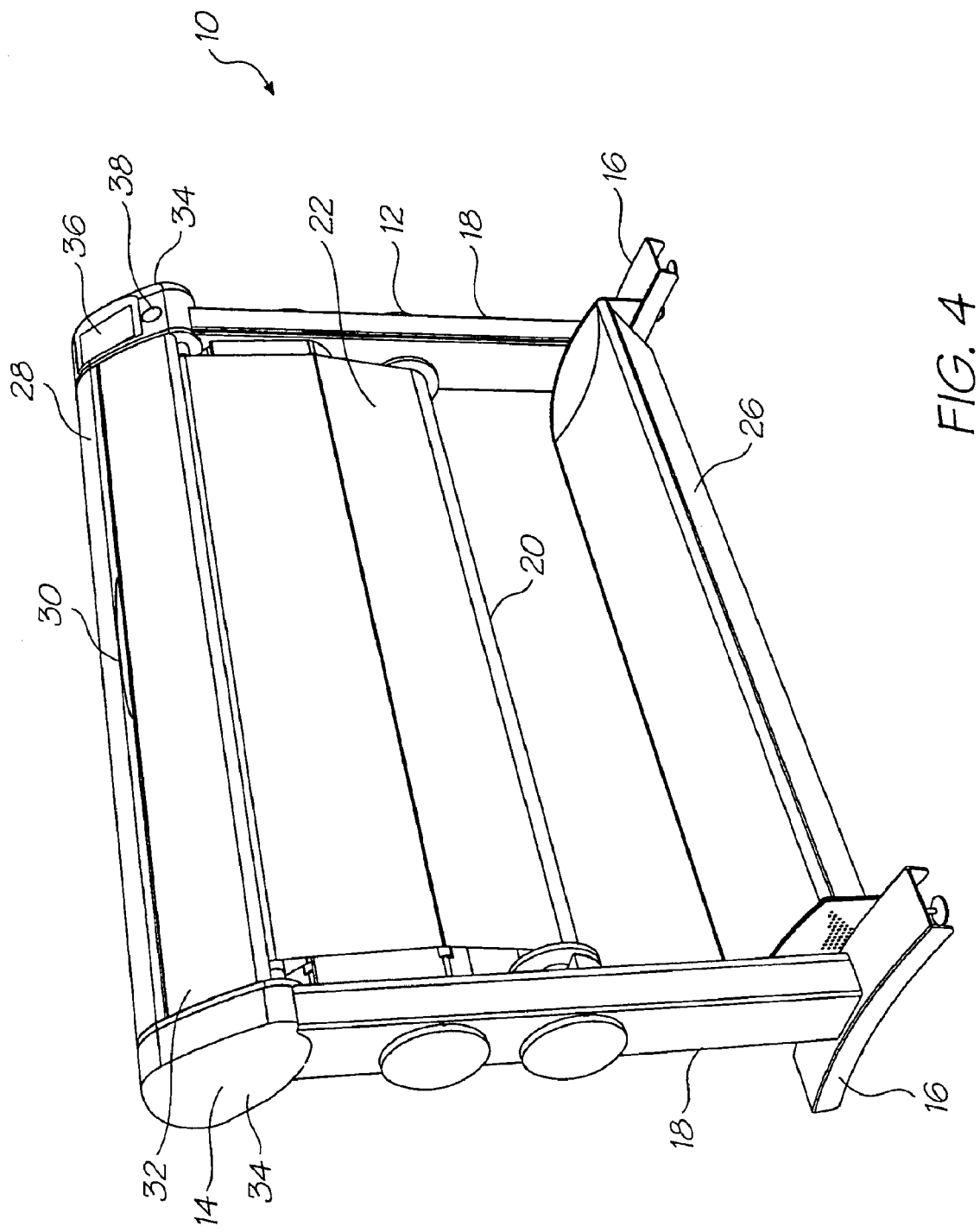
FIG. 4 shows a three dimensional, external view of the printer.

In FIG. 4, reference numeral 10 generally indicates a printer, in accordance with the invention.

The printer 10 has a support structure 12 that supports a print assembly 14, also in accordance with the invention, above a substrate. The support structure 12 includes a pair of spaced feet 16 and a leg 18 extending from each foot 16. The print assembly 14 is mounted on the legs 18 to span the legs 18.

A media tray 20 is positioned between the legs 18. The media tray 20 is configured to store suitable print media, such as paper 22.

The paper 22 is fed from a media feed mechanism in the form of a media roll 166 through the print assembly 14 and on to a take up spool 24. An electronics enclosure 26 is also positioned between the legs 18 to enclose various electronic components that are described below.

The print assembly 14 includes a lid 28, with a handle 30, and a front cover 32. The lid 28 and front cover 32 are positioned between a pair of end moldings 34.

The print assembly 14 also includes a color TFT LCD 36 with touch screen navigation. A stop button 38 is also provided to enable a user to stop operation of the print assembly 14.

The print assembly 14 and its various components are shown in further detail in the remaining Figures.

Figure 1:
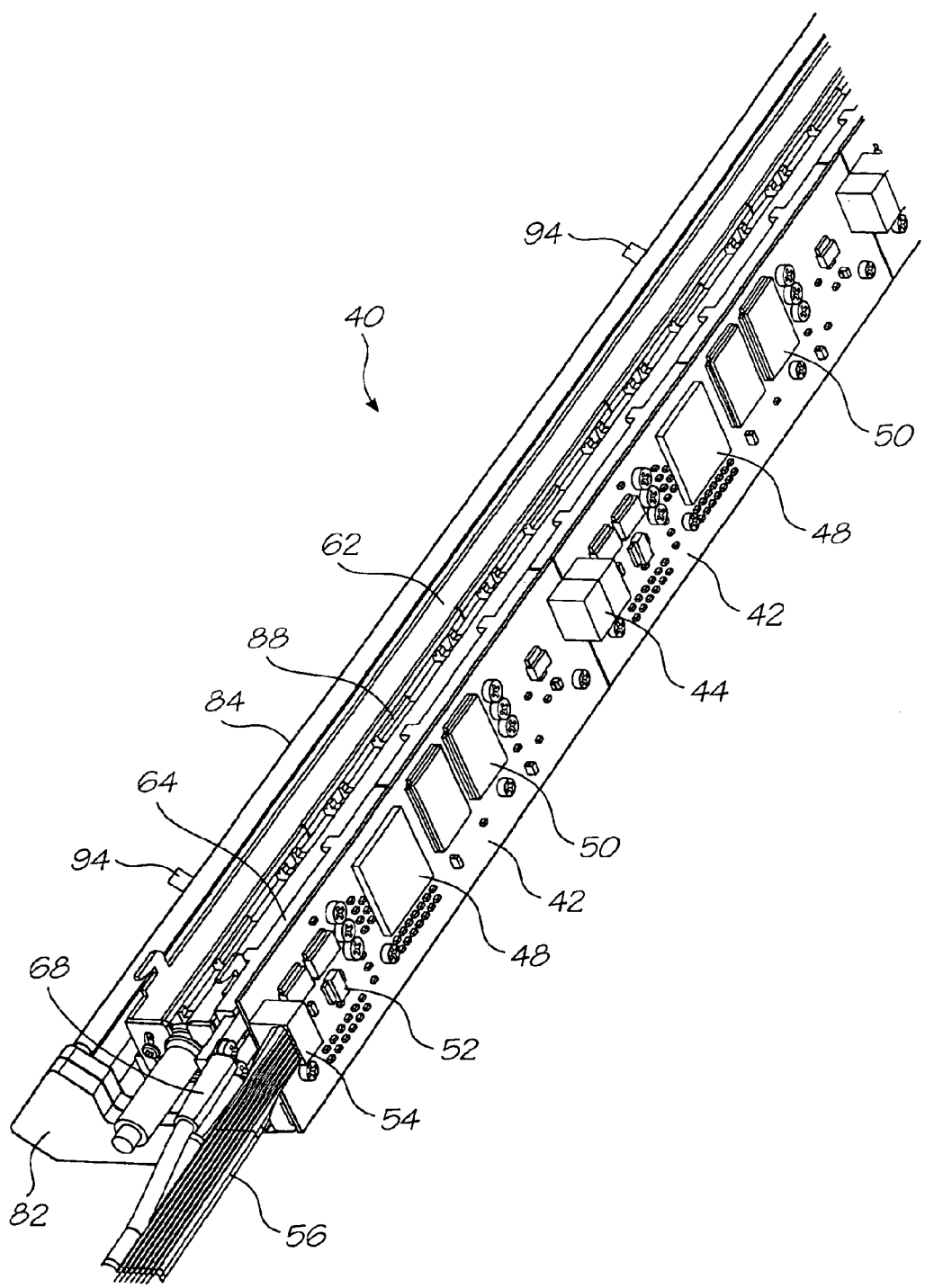
FIG. 1 shows a schematic, three-dimensional view of part of a printing mechanism of a print assembly, in accordance with the invention, of a printer, also in accordance with the invention.
Figure 2:
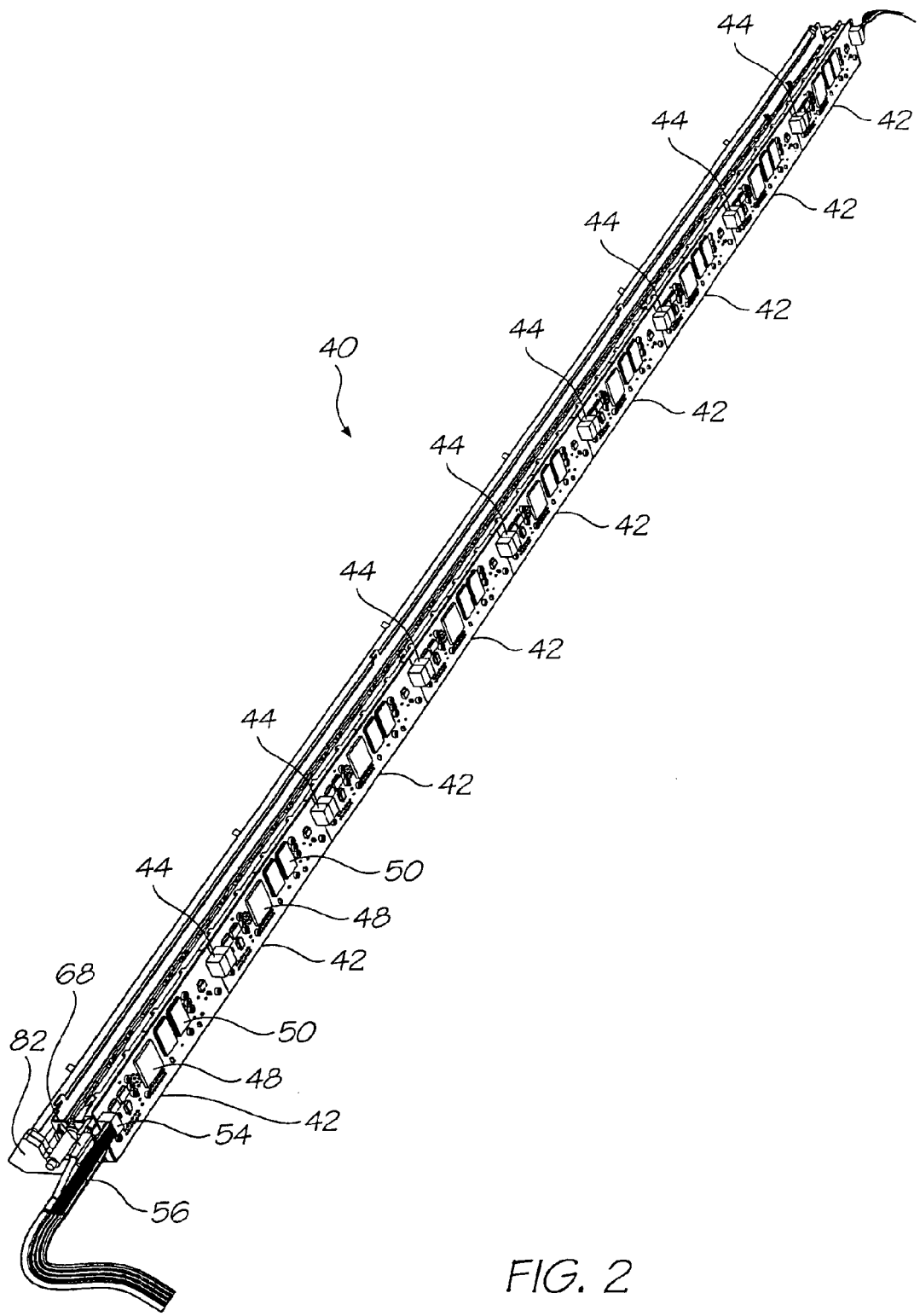
FIG. 2 shows a front view of the printing mechanism of FIG. 1.
Figure 3:
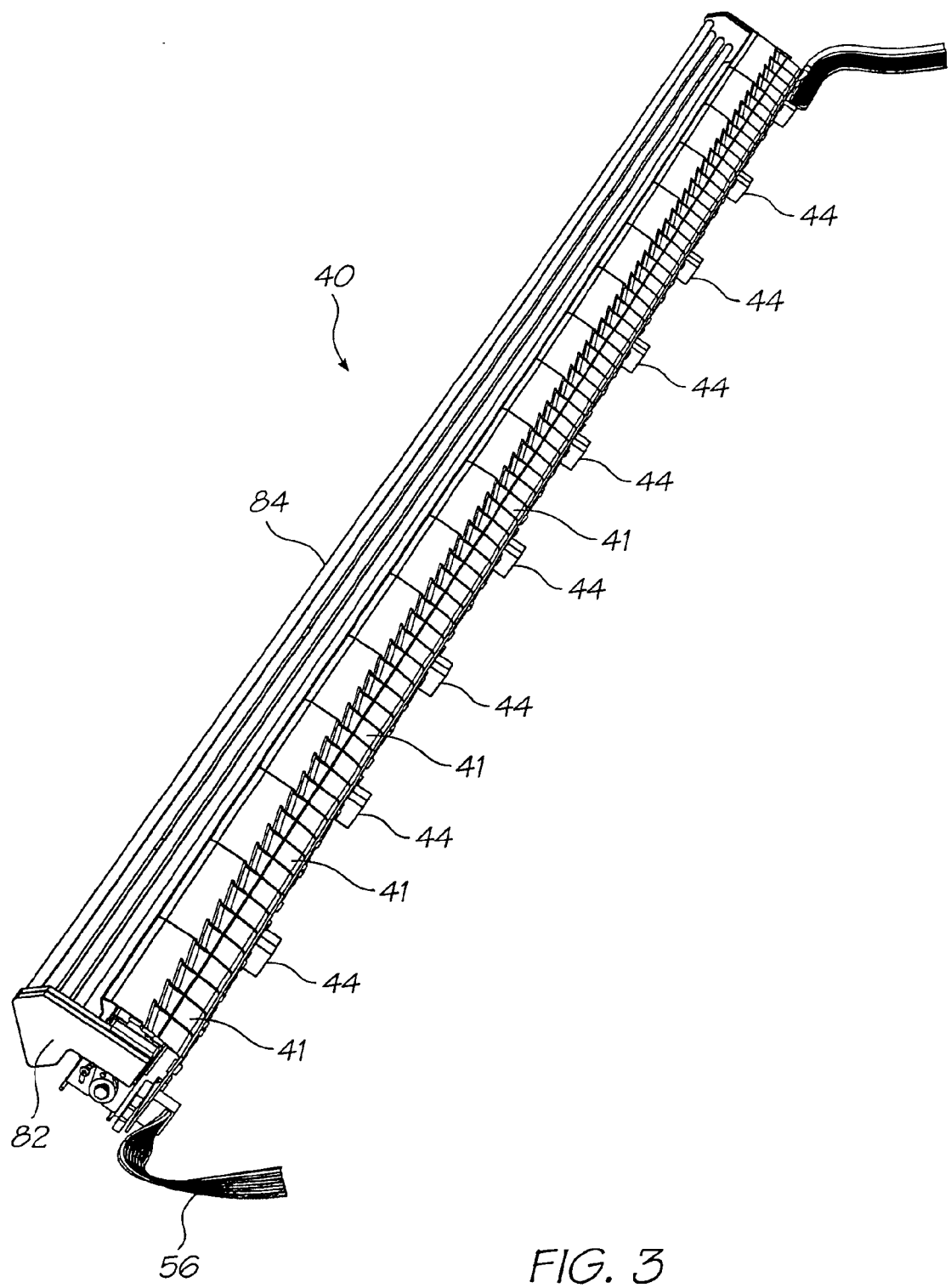
FIG. 3 shows a rear view of the printing mechanism of FIG. 1.

In FIGS. 1 to 3, reference numeral 40 generally indicates a printing mechanism of the print assembly 14. As can be seen in the drawings, the printing mechanism 40 is segmented. In particular, the printing mechanism 40 includes an image processing apparatus, in accordance with the invention, that includes nine printed circuit boards (PCB's) 42 connected to each other with corresponding connector blocks 44.

The printing mechanism 40 further includes a printhead 41 having seventy-two printhead modules 46. Each PCB 42 is configured to control eight printhead modules 46. It follows that nine PCB's 42 are provided. The printhead modules 46 are described in further detail below.

Each PCB 42 includes a print engine controller (PEC) 48. The PEC's 48 are also described in further detail below.

Each PCB 42 also includes a memory storage device in the form of memory chips and more particularly in the form of 64 Mbit external DRAM chips 50. The DRAM chips 50 cooperate with the PEC 48 in a manner that is described below.

Further, each PCB 42 includes a quality authentication (QA) chip 52. Details of a suitable QA chip are set out in the above referenced U.S. Pat. No. 6,362,868 and are therefore not set out in this description. The QA chip 52 serves to inhibit unauthorized refilling of ink in the manner described in U.S. Pat. No. 6,362,868, in addition to other functions such as ensuring the quality of print media used with the printer 10.

An endmost PCB 42 includes a serial connector 54 that permits serial data cables 56 to be connected to the PCB's 42.

Each PCB 42 is connected to its associated printhead modules 46 with a flexible PCB 58.

The printing mechanism 40 includes a metal chassis 60 that extends between a pair of side moldings 61 that are positioned in the end moldings 34. The PCB's 42 are mounted on the chassis 60. The chassis 60 has a generally U-shaped cross section. A channel 62 of an Invar alloy is positioned on the chassis 60.

A chassis molding 64 of a plastics material is positioned on an outside of the chassis 60 and the channel 62. Each PCB 42 is mounted on the chassis molding 64.

The chassis molding 64 defines a pair of recesses 66 on an outer side of the chassis molding 64. The recesses 66 extend a length of the chassis molding 64. A busbar 68 is positioned in each recess 66. The busbars 68 are configured to supply electrical power to the PCB's 42.

An ink reservoir assembly 70 is positioned in the Invar channel 62. The ink reservoir assembly 70 includes an ink distribution arrangement 72. Each printhead module 46 is positioned on a respective ink distribution arrangement 72. In particular, each printhead module 46 is removably mounted on its ink distribution arrangement 72 to facilitate removal and replacement when necessary.

The ink reservoir assembly 70 includes a plurality of ink reservoir moldings 76. Each ink reservoir molding 76 corresponds with an associated printhead module 46. The ink reservoir moldings 76 are positioned end-to-end along and within the Invar channel 62. Each ink reservoir molding 76 defines a plurality of elongate ink channels 74, each accommodating a differently colored ink. Thus, effective elongate ink channels extend a length of the Invar channel 62.

An end cap molding 78 is positioned on an endmost ink reservoir molding 76. The end cap molding 78 has a plurality of connectors 80 defined thereon and in alignment with respective ink channels 74 when the end cap molding 78 is positioned on said endmost ink reservoir molding 76. The connectors 80 are connectable to an ink hose connector 82. The ink hose connector 82 is, in turn, connected to each of a plurality of ink hoses 84. It follows that each hose 84 is in fluid communication with a respective ink channel 74. Each hose 84 supplies the ink reservoir assembly 70 with ink of a particular color. For example, the hoses 84 can carry Cyan (C), Magenta (M), Yellow (Y) and Black (K) inks, respectively. In this case, four hoses 84 are provided. Also, each reservoir molding 76 defines four ink channels 74. Alternatively, the hoses 84 can carry Cyan (C), Magenta (M), Yellow (Y), Red (R), Green (G) and Blue (B) inks, respectively. In this case, six hoses 84 are provided. Also, each reservoir molding 76 then defines six ink channels 74. Instead of six differently colored inks, the six hoses 84 can carry CMYK and Infrared (IR) inks and a fixative (F) for high speed printing so that the inks can dry rapidly.

Each hose 84 is connected to a respective ink container 86 (FIG. 5), so that each hose 84 is connected between an ink container 86 and a particular ink channel 74. The hoses 84 are connected to their respective containers 86 with T-piece connectors 94 shown in FIG. 1.

The print assembly 14 includes a plurality of capping devices 88 that correspond with respective printhead modules 46. Each capping device 88 is displaceable between an operative position in which it serves to cap its respective printhead module 46, to inhibit drying of ink, and an inoperative position in which ink can be ejected from the printhead module 46. A camshaft 90 is positioned in the chassis 60. A translating member 92 interconnects the camshaft 90 and the capping devices 88, so that rotational movement of the camshaft 90 results in reciprocal movement of the capping devices 88 between their operative and inoperative positions.

Figure 5:
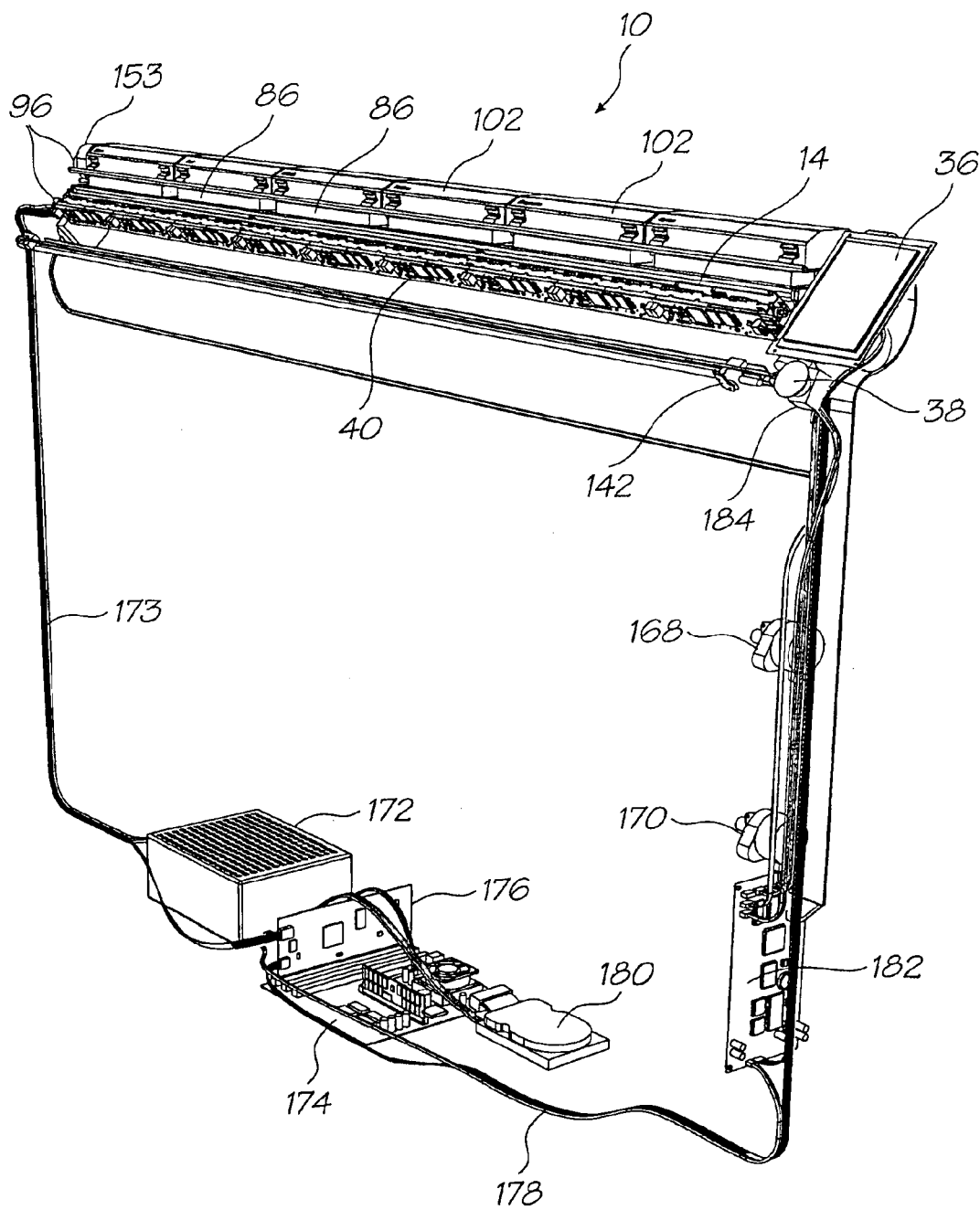
FIG. 5 shows a schematic, three-dimensional view of operative parts of the printer.

The camshaft 90 is driven with a suitable motor, indicated generally at 96 in FIG. 5.

Figure 7:
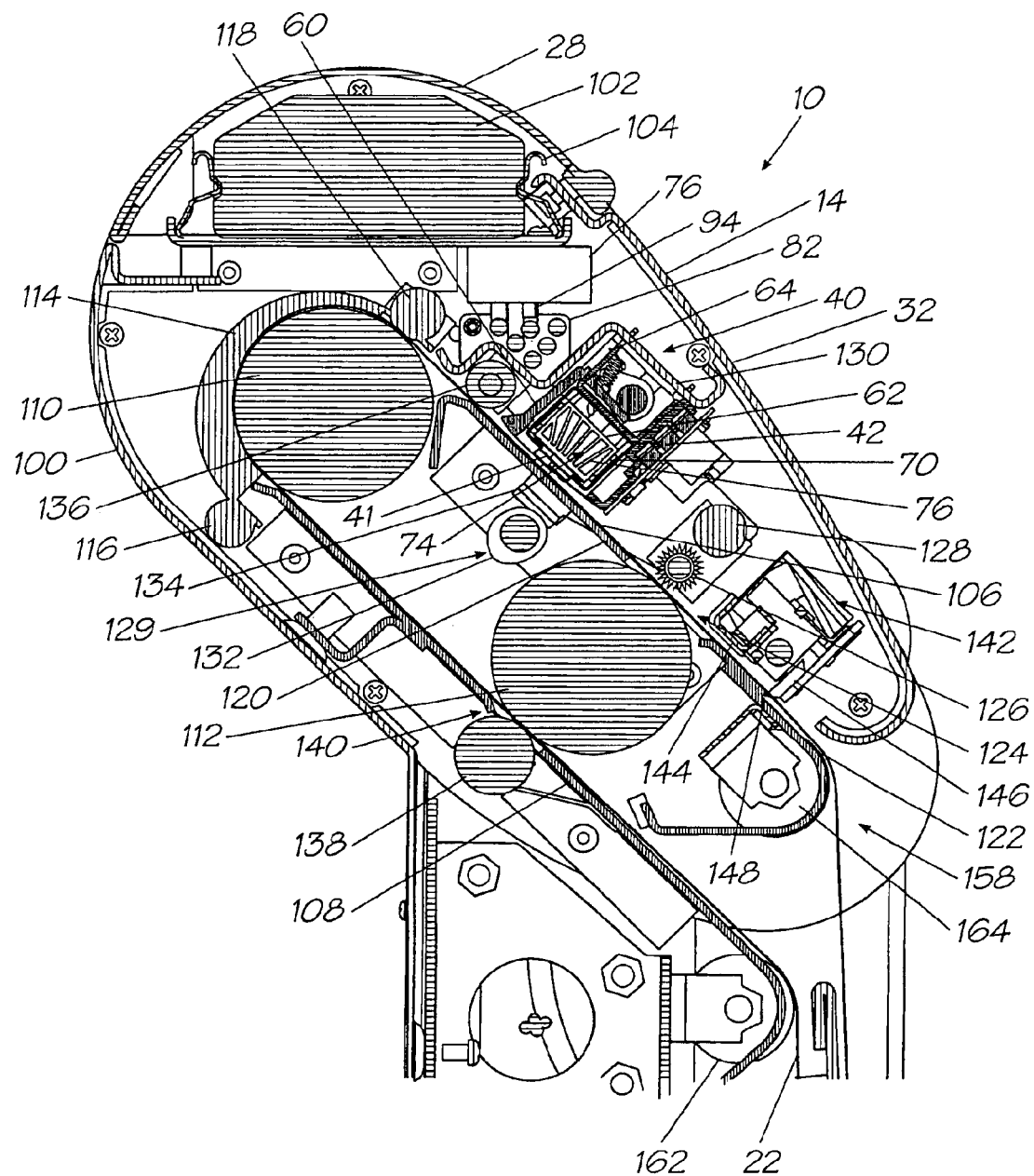
FIG. 7 shows a schematic, side sectioned view of a portion of the printer incorporating the print assembly.
Figure 8:
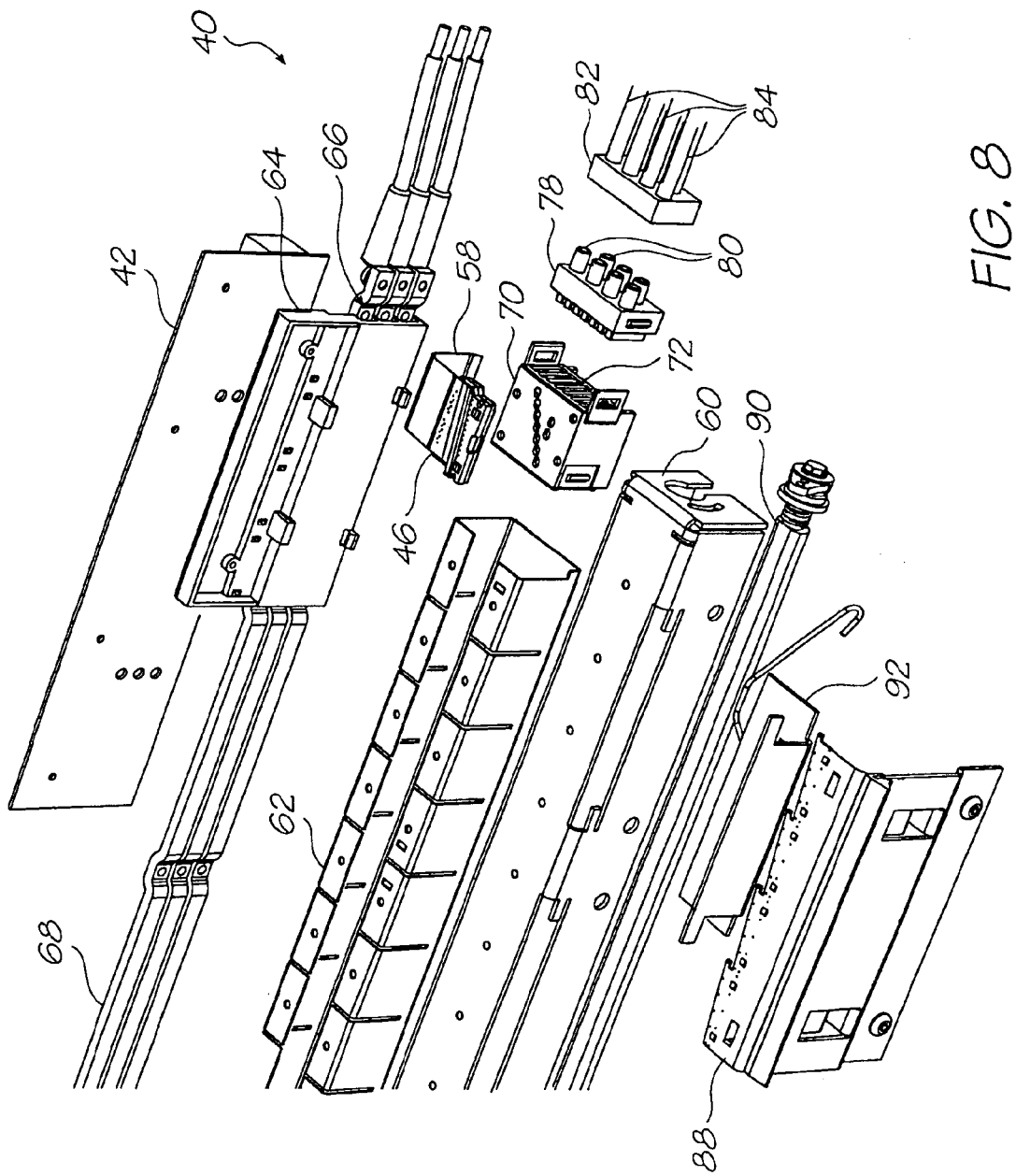
FIG. 8 shows an exploded view of an operative portion of the printing mechanism.

Further detail of the print assembly 14 is shown in FIG. 7. As can be seen in this drawing, the front cover 32, the lid 28 and a rear cover 98 together define a housing 100 for the print assembly 14.

A plurality of ink cartridges 102 is positioned beneath the lid 28. Each ink cartridge 102 stores one of the inks mentioned above. Each ink cartridge 102 is positioned between a pair of clips 104 so that it can be replaced when necessary. Each ink cartridge 102 and a respective ink reservoir 86 are in fluid communication with each other, when the ink cartridge 102 is received between the clips 104.

A pair of platens, in the form of an upper platen 106 and a lower platen 108 is positioned within the housing 100. A pair of spaced primary rollers in the form of an upper primary roller 110 and a lower primary roller 112 is provided to displace the paper 22 through the print assembly 14. The upper roller 110 is positioned at an upper end of the platens 106, 108, while the lower roller 112 is positioned between the platens 106, 108. The rollers 110, 112 are configured to drive a sheet of the paper 22 over, consecutively, an inner surface of the lower platen 108 and an outer surface of the upper platen 106. Thus, the paper 22 passes over the upper roller 110, while the lower roller 112 is positioned between upwardly and downwardly moving portions of the paper 22.

A brush 114 is pivotally mounted at 116 to the housing 100. The brush 114 has an arcuate transverse profile that corresponds with the upper primary roller 110. The brush 114 is positioned in the housing 100 so that the paper 22 can pass between the brush 114 and the housing 100.

A pinch roller 118 is positioned downstream of the brush 114 to bear against the upper primary roller 110. Thus, when the paper 22 is displaced from between the brush 114 and the upper primary roller 110, the pinch roller 118 retains the paper 22 against lateral movement.

The upper platen 106 defines an upper printing zone 120 and a lower cutting zone 122. A gap 124 is defined between the upper and lower printing zones 120, 122. A plurality of spiked wheels 126 is partially received through the gap 124 to engage the paper 22 and the lower primary roller 112. A crossbar 128 is operatively positioned with respect to the spiked wheels 126 to retain the spiked wheels 126 in position. The spiked wheels 126 and the pinch roller 118 are configured so that a suitable tension is set up in the paper 22 when the paper 22 passes over the printing zone 120 of the upper platen 106.

The chassis 60 and channel 62 are positioned above the printing zone 120 of the upper platen 106. The chassis 60 and the channel 62 are connected to a displacement mechanism 129 so that the chassis 60 and channel 62 can be displaced from the printing zone 120 when necessary. In particular, the chassis 60 and channel 62 are displaceable between an operative position in which the printhead modules 46 are a distance from the printing zone 120 that is suitable for printing and an inoperative position in which the paper 22 can be released from the printing zone 120.

The chassis 60 and channel 62 are connected to the pinch roller 118 with suitable metalwork 130. Further, the chassis 60 and channel 62 are connected to the crossbar 128. It follows that, when the displacement mechanism 129 is operated, the pinch roller 118 and the spiked wheels 126 are displaced from the upper platen 106 together with the chassis 60 and the channel 62.

The displacement mechanism 129 includes a camshaft 132 and a pusher 134. The pusher 134 is connected to the chassis 60 and the channel 62 so that, upon rotation of the camshaft 132, the chassis 60 and channel 62 are displaced towards and away from the printing zone of the upper platen 106.

Upper idler rollers 136 are rotatably mounted above the upper platen 106 so that the paper 22 is received between the upper platen 106 and the upper idler rollers 136.

A lower, sprung idler roller 138 is mounted on the lower platen 108 to be partially received through a gap 140 defined in the lower platen 108. The sprung idler roller 138 is configured and positioned to bear against the lower primary roller 112. Thus, an upwardly moving portion of the paper 22 is gripped, and passes between, the lower primary roller 112 and the sprung idler roller 138.

The print assembly 14 includes a cutting mechanism 142 that is mounted in the housing 100 above the cutting zone 122 of the upper platen 106. The cutting mechanism includes a cutter 146 that traverses the paper 22 to cut the paper 22. The cutting mechanism 142 includes an optical sensor 144 so that the cutter 146 can be stopped when it reaches an end of a cutting stroke. The cutting zone 122 defines a cutting formation 148 that cooperates with the cutter 146 to facilitate cutting of the paper 22.

Figure 6:
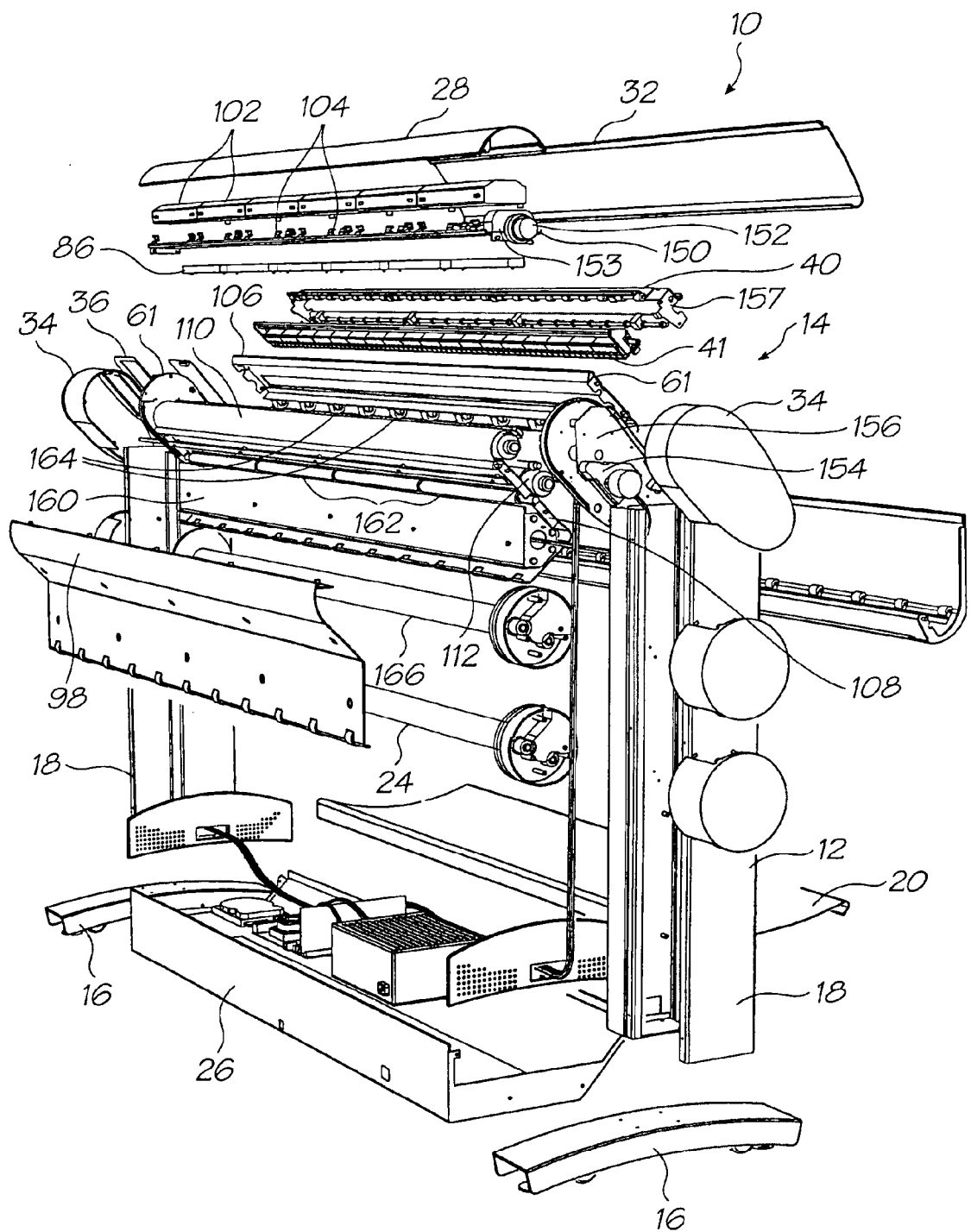
FIG. 6 shows a schematic, exploded view of the printer.

As can be seen in FIG. 6, the print assembly 14 includes an air impeller 150 and a motor 152 to drive the air impeller 150. The air impeller 150 serves to generate an air current within the housing 100 for cooling purposes. An air filter 153 is also positioned in the housing 100 to filter the air passing through the housing 100. The air impeller 150 also serves to generate the air current to a sufficient extent to minimize the build up of dust on the printhead modules 46.

As can further be seen in FIG. 6, the primary rollers 110, 112 are connected to a gearbox 154 that is mounted on a bracket 156. The gearbox 154 and bracket 156 are positioned on one of the legs 18 and covered with one of the end moldings 34. Thus, the primary rollers 110, 112 serve to drive the paper 22 through the print assembly 14.

A printhead bracket 157 is positioned in the housing 100 and extends between the legs 18. The printhead bracket 157 provides a support structure for the chassis 60 and channel 62. The printhead bracket 157 also provides a support structure for the upper idler rollers 136.

The housing 100 is shaped to define an opening 158 for passage of the paper 22 into and out of the print assembly 14. Feed rollers 162 are rotatably mounted on a tie bar 160 that extends between the legs 18. The feed rollers 162 are positioned so that the paper 22 passes over the feed rollers 162 when the paper is fed into the print assembly 14. The tie bar 160 also serves a structural purpose in that it provides structural rigidity to the printer 10.

Discharge rollers 164 are rotatably mounted on the upper platen 106. The discharge rollers 164 are positioned so that the paper 22 passes over the discharge rollers 164 when the paper 22 is fed from the print assembly 14.

Both the media roll 166 and the take up spool 24 are driven with a media roll drive motor 168 and a take up spool drive motor 170, respectively (FIG. 5).

The printer 10 includes a power supply unit 172 that is positioned in the electronics enclosure 26. The power supply unit 172 is configured to be powered by either a 110V or 220V power supply. Further, the power supply unit 172 is configured so that up to 90 Amps can be drawn from the power supply unit 172. The power supply unit 172 is connected with power cables 173 to various components of the printer 10, such as the various drive motors to supply the components with required operational energy.

The printer 10 includes an ATX motherboard 174 that is also positioned in the electronics enclosure 26. A printhead interface card 176 is mounted on the motherboard 174. The printhead interface card 176 is connected to the nine PCB's 42 with suitable data cables 178. Thus, conventional print data supplied to the interface card 176 from the motherboard 174 can be converted into a suitable form for reading by the various PCB's 42.

The printer 10 includes a hard drive unit 180. Conveniently, the hard drive unit 180 can have a capacity of 40 Gigabytes. This facilitates the storage of entire images to be printed. The hard drive unit 180 is connected to the motherboard 174 in a conventional fashion. The hard drive unit 180 is a conventional hard drive unit and is therefore capable of storing images in any number of formats, such as the well-known JPEG format. The manner in which the image data is read from the hard drive unit 180 is also conventional. As is set out below, printing of the images is digitally controlled as a result of the printhead technology utilized in this invention. It follows that transferal of image data from the hard drive unit 180 to the PCB's 42, via the printhead interface card 176 can take place without the requirement of significant data transformation, in particular, without the requirement of digital to analogue signal conversion.

The interface card 176 is also connected to a motor and LCD controller PCB 182 to control operation of the various drive motors and the TFT LCD. Details of such control are set out in the above referenced applications and are therefore not provided in this description. The motor and LCD controller PCB 182 is connected to a cut off switch 184 that is, in turn, connected to the stop button 38 so that operation of the printer 10 can be halted.

Figure 13:
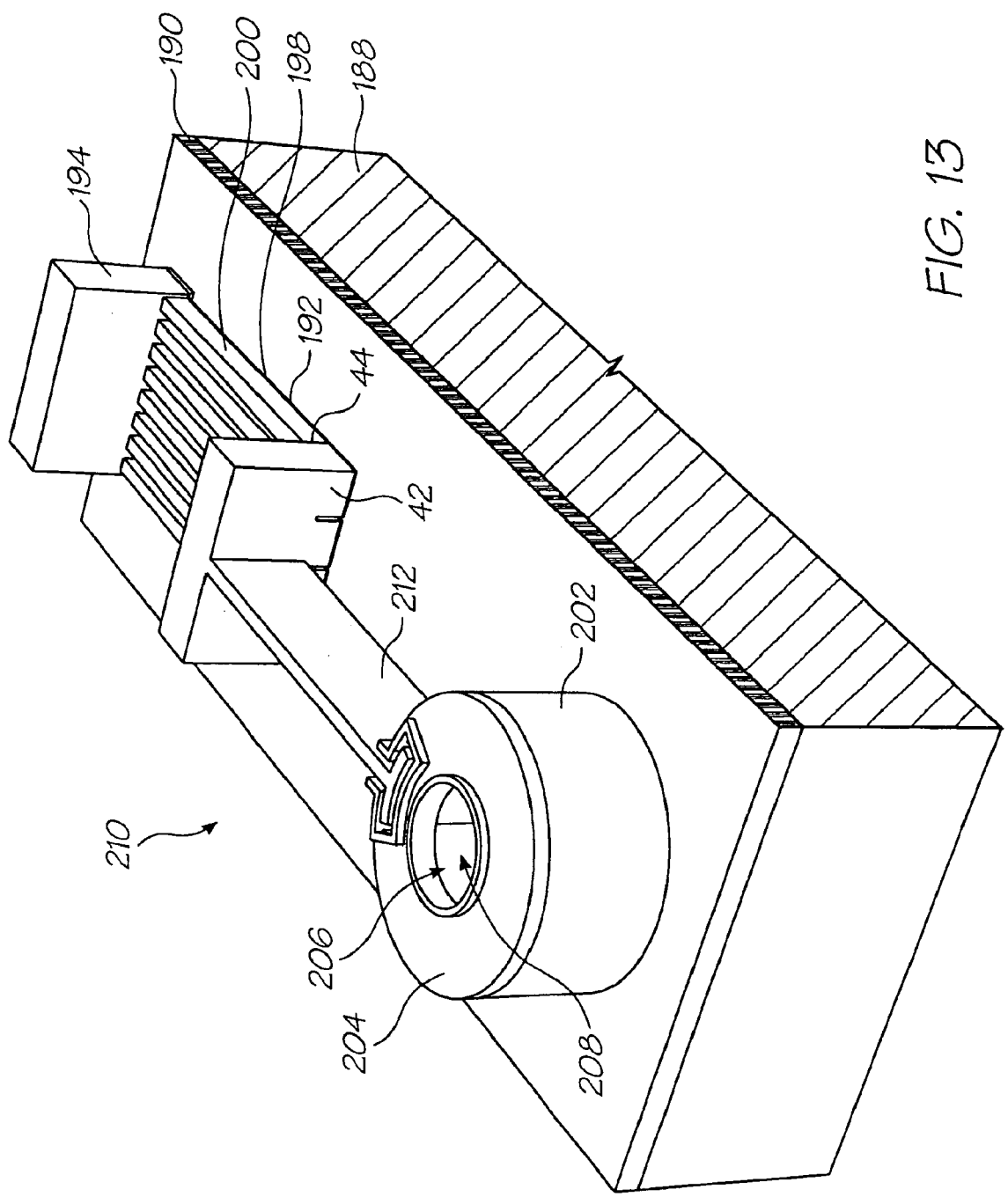
FIG. 13 shows a schematic, three-dimensional view of part of a printhead chip of the print assembly of the printer, showing one nozzle arrangement of the printhead chip.
Figure 14:
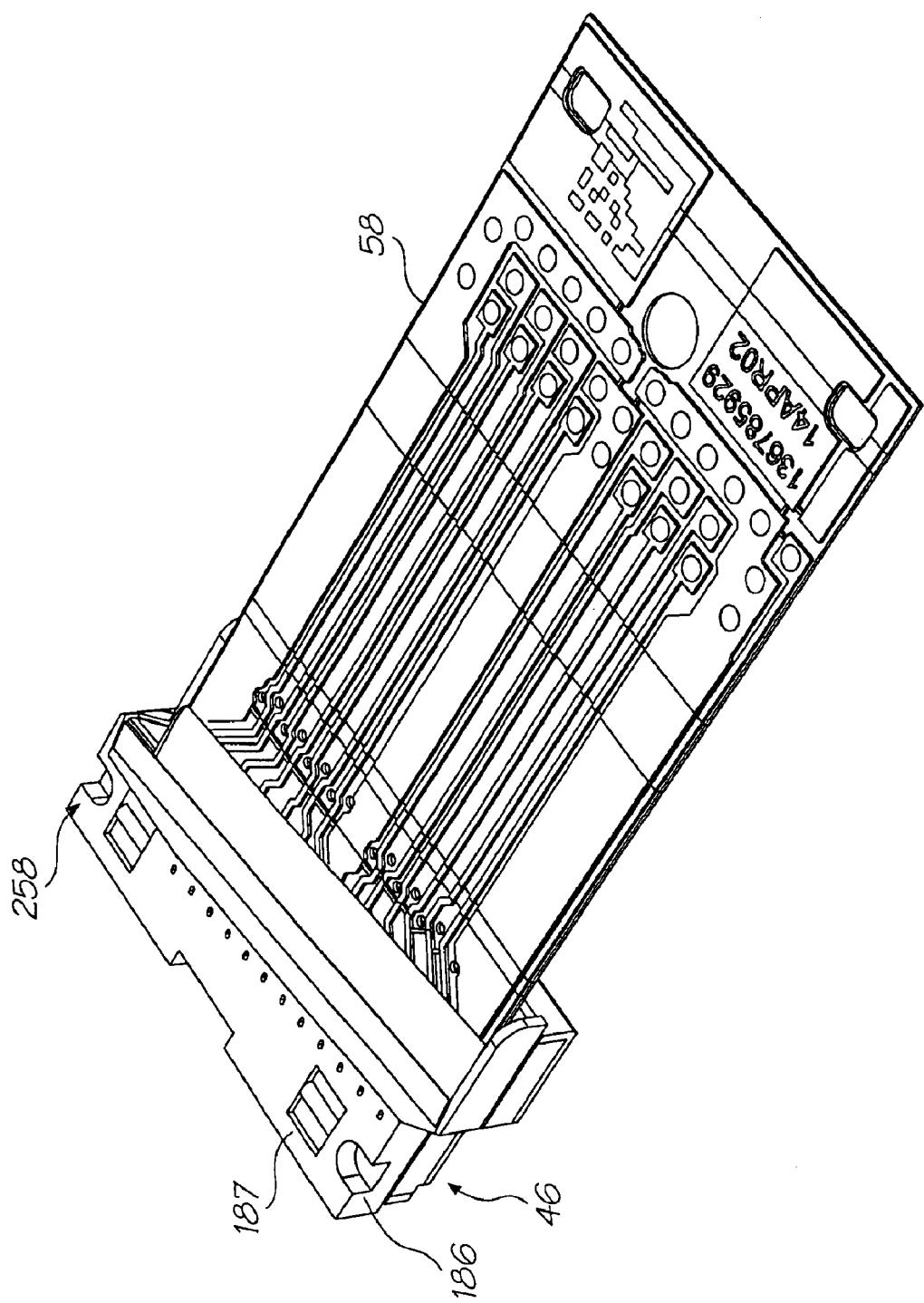
FIG. 14 shows a schematic, three-dimensional view of a printhead module that incorporates a printhead chip.

As can be seen in FIG. 14, the printhead modules 46 each include a printhead chip 186. The printhead chip 186 can be in the form of any of the printhead chips described in the above referenced applications/patents. Each printhead module 46 includes a carrier 187 in which the printhead chip 186 is positioned. The carrier 187 defines a suitable connection zone for the flexible PCB 58 associated with the printhead chip 186. FIG. 13 shows a schematic diagram of part of a printhead chip 186 that is suitable for use in the printer 10. Each printhead module 46 includes what are known as on chip fiducials 258. The on chip fiducials 258 are essentially in the form of markers to facilitate accurate alignment of the printhead modules 46 in the print assembly 14.

The printhead chip 186 is described in detail in the above referenced U.S. Pat. No. 6,416,167 and will therefore not be described in such detail in this specification. Briefly, however, the chip 186 includes a wafer substrate 188. A CMOS drive circuitry layer 190 is positioned on the wafer substrate 188 and is connected to the flexible PCB 58.

A plurality of nozzle arrangements 210 is positioned on the CMOS drive circuitry layer 190. For the purposes of convenience, one such nozzle arrangement 210 is shown in FIG. 13. The printhead chip 186 comprises a multiple replication of the nozzle arrangement 210 on the wafer substrate 188. As set out in the above referenced applications and patents, the printhead chip 186 is the product of an integrated circuit fabrication technique. Replication of components in order to achieve a product is a well-known feature of such a fabrication technique. It follows that the printhead chip 186 can readily be understood by a person of ordinary skill in the field of chip fabrication.

Each nozzle arrangement 210 includes a thermal bend actuator 192 that is positioned on the CMOS layer 190 to receive an actuating signal from the CMOS layer 190. In particular, the thermal bend actuator 192 includes a support post 194 that is mounted on the CMOS layer 190 to extend from the CMOS layer 190. The thermal bend actuator 192 includes an actuator arm 196 that is fixed to, and extends from, the support post 194. The actuator arm 196 includes a heating layer 198 in the form of an electrical heating circuit of a material having a coefficient of thermal expansion that is such that the material is capable of performing useful work on a MEMS scale as a result of expansion upon heating. The heating layer 198 is positioned on a layer 200 of a material having a coefficient of thermal expansion that is less that that of the heating layer 198 defining the electrical heating circuit. The heating layer 198 is positioned intermediate the layer 200 and the substrate 188 so that the actuator arm 196 is bent away from the substrate 188 when a current is passed through the heating layer 198.

Nozzle chamber walls 202 are positioned on the CMOS layer 190. A roof wall 204 is positioned on the nozzle chamber walls 202. The nozzle chamber walls 202 and the roof wall 204 define a nozzle chamber 206. The roof wall 204 defines an ink ejection port 208 from which ink is ejected, in use.

A paddle member 212 is mounted on the actuator arm 196 to extend into the nozzle chamber 206. The paddle member 212 is configured and positioned in the nozzle chamber 206 so that, upon displacement of the actuator arm 196, as described above, ink is ejected from the nozzle chamber 206.

The actuator arm 196 is connected to the CMOS layer 190 through the support post 194 so that the heating layer 198 can receive an electrical signal from the CMOS layer 190.

Figure 9:
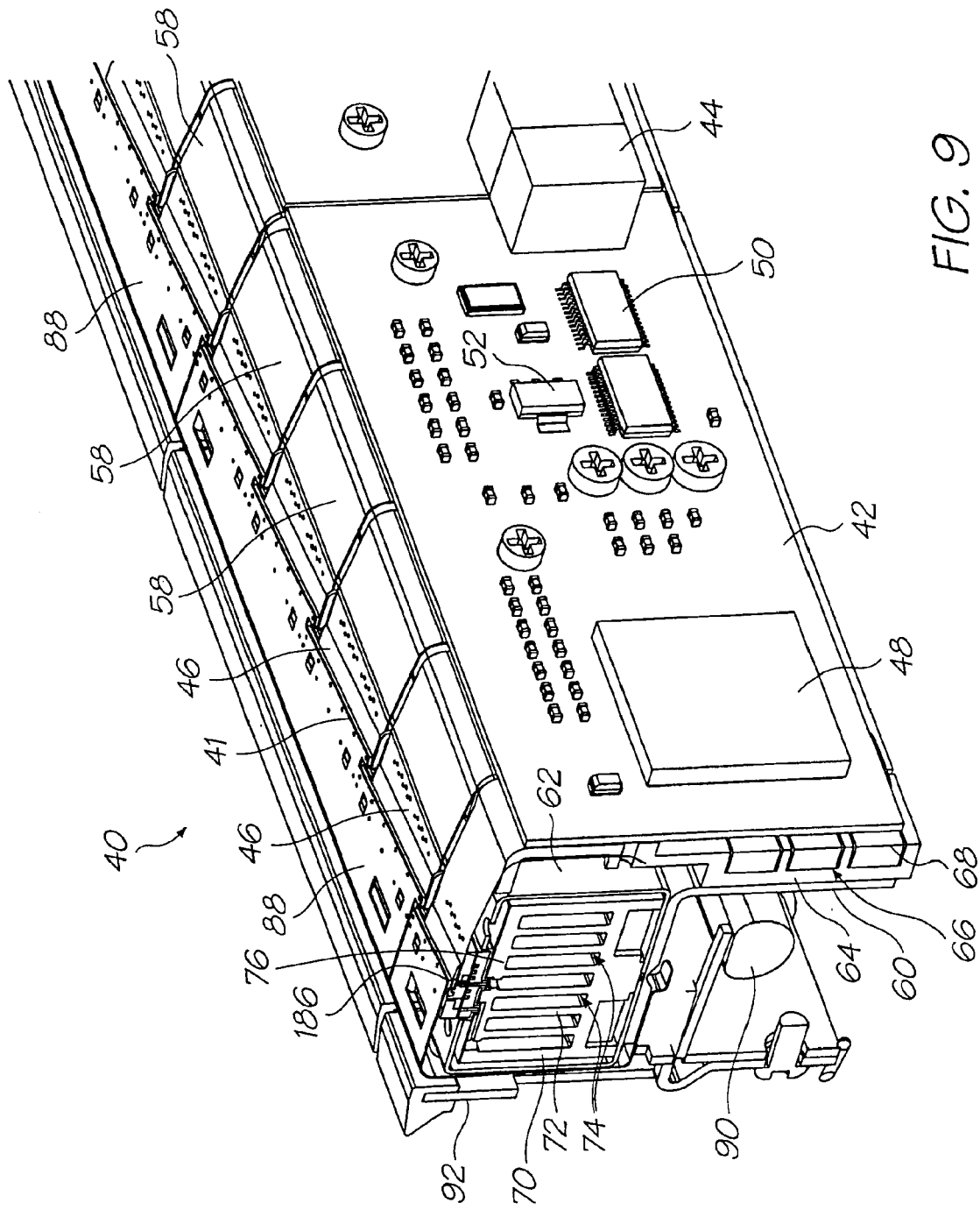
FIG. 9 shows a cross sectional view of an operative portion of the printing mechanism.

As can be seen in FIGS. 3 and 9, the printhead chips 186 are each positioned at an angle with respect to a straight line running the length of the printing zone 120. This facilitates a measure of overlap at adjacent ends of the printhead chips 186 to ensure printing continuity.

It is clear from the above referenced United States applications and patents that a pagewidth printhead including printhead chips as described above can incorporate up to 84 000 nozzle arrangements. It follows that, by using the printhead chips 186, it is possible for the print assembly 14 to have over as many as 200 000 nozzle arrangements. It follows that over 200 000 dots can be printed on the paper 22 in the printing zone 120. In one particular example, the seventy-two printhead chips 186 provide a print width of 57.6 inches with 552 960 nozzle arrangements 210.

The nozzle arrangements 210 of each chip 186 are positioned side-by-side in two rows in a staggered fashion. It follows that true 1600 dpi printing can be achieved with the printhead chips 186.

Each printhead chip 186 therefore includes 7680 nozzle arrangements 210. Each nozzle arrangement 210 is independently controlled by the PCB 42 to eject a 1-picoliter drop on demand. The integrated circuit fabrication technology used is based on Very Large Scale Integration (VLSI) technology that is fully described in the above referenced applications and patents. As a result of the manufacturing techniques used, each nozzle arrangement 210 can be as little as 32 microns wide. This allows each printhead chip 186 to have a surface area as little as 21 mm$^2$.

The characteristics of each nozzle arrangement 210 are such that it is capable of being driven at a cyclical rate of up to 80 kHz by its associated PEC 48. This permits printing of up to 21.6 billion drops per second that provides thirty-five thousand square feet per hour at 1600 dpi.

Each printhead chip 186 is connected to its associated PCB 42 with the flexible PCB 58. It follows that each flexible PCB 58 is connected to the CMOS layer 190 of its associated printhead chip 186.

Each PEC 48 is a page rendering engine application specific integrated circuit (ASIC) that receives input data relating to compressed page images from the printhead interface 176. The PEC 48 produces decompressed page images at up to six channels of bi-level dot data as output. It will be appreciated that each PEC 48 communicates with eight printhead chips 186 in this example. Each PEC 48 is capable, however, of communication with up to sixteen such printhead chips 186. In particular, each PEC 48 can address up to sixteen printhead chips in up to six color channels at 15 000 lines/sec. It follows that each PEC 48 allows for a 12.8-inch printhead width for full bleed printing of A3, A4 and letter pages.

Each PEC 48 is color space agnostic. This means that the PEC 48 can accept print data in any color. While each PEC 48 can accept contone data as CMYX or RGBX where X is an optional fourth channel, it can also accept contone data in any print color space. Additionally, each PEC 48 is configured to define a mechanism for arbitrary mapping of input channels to output channels. The PEC 48 is also configured for combining dots for ink optimization and the generation of channels based on any number of other channels. In this example, data input is typically based on CMYK for contone printing, K for a bi-level input, fixative, and optional further ink channels. The PEC 48 is also configured to generate a fixative channel for fast printing applications.

Each PEC 48 is configured to be resolution agnostic. This means that each PEC 48 simply provides a mapping between input resolutions and output resolutions by means of various scale factors. In this example, the expected output resolution is 1600 dpi. However, the PEC 48 does not store any data to this effect.

Each PEC 48 is also configured to be page-length agnostic. Each PEC 48 operates a printing band at a time and a page can have any number of bands. It follows that a "page" can have any reasonable length.

Each PEC 48 defines an interface so that it can be synchronized with other PEC's 48, as is the requirement with this invention. This allows a simple two-PEC solution for simultaneous A3/A4/Letter duplex printing. This also allows each PEC 48 to be responsible for the printing of only a portion of a page. It will be appreciated that combining synchronization functionality with partial page rendering allows multiple PEC's to be readily combined for alternative printing requirements including simultaneous duplex printing, wide format printing, commercial printing, specialist high contone resolution printing, and printing applications where more than six ink channels are required.

The following table sets out the features of each PEC 48 and its associated benefits.

TABLE 1

Features and Benefits of PEC

| Feature | Benefits |
|---|---|
| Optimized print architecture in hardware | 30 ppm full page photographic quality color printing from a desktop PC |
| 0.18 micron CMOS (>3 million transistors) | High speed<br>Low cost<br>High functionality |
| 1.8 billion dots per second | Extremely fast page generation |
| 15,000 lines per second at 1600 dpi | 1.1 A4/Letter pages per PEC chip per second |
| 1 chip drives up to 122,880 nozzles | Low cost page-width printers |
| 1 chip drives up to 6 color planes | 99% of printers can use 1 chip per page |
| Sophisticated internal memory buffering and caching | Only requires 1 external memory, leading to low cost systems |
| JPEG expansion | low bandwidth from PC<br>low memory requirements in printer |
| Lossless bitplane expansion | high resolution text and line art with low bandwidth from PC (e.g. over USB) |
| Netpage tag expansion | Generates interactive paper |
| Stochastic dispersed dot dither | Optically smooth image quality<br>No moire effects |
| Hardware compositor for 6 image planes | Pages composited in real-time |
| Dead nozzle compensation | Extends printhead life and yield<br>Reduces printhead cost |
| Color space agnostic | Compatible with all inksets and image sources including RGB, CMYK, spot, CIE L*a*b*, hexachrome, YCrCbK, sRGB and other |
| Color space conversion | Higher quality/lower bandwidth |
| Computer interface agnostic | Works with USB1, USB2, IEEE1394 (Firewire), ethernet, IEEE1284 (Centronics) |
| Variable page length | Print any page length (up to 64 km) |
| Cascadable in resolution | Printers of any resolution |
| Cascadable in color depth | Special color sets e.g. hexachrome can be used |
| Cascadable in image size | Printers of any width |
| Cascadable in pages | Printers can print both sides simultaneously |
| Cascadable in speed | Very high speed printers can be built |
| Fixative channel data generation | Extremely fast ink drying without wasteage |
| Built-in security | Revenue models are protected |
| Undercolor removal on dot-by-dot basis | Reduced ink useage |
| Does not require fonts for high speed operation | No font substitution or missing fonts |
| Flexible printhead configuration | Many configurations of printheads are supported by one chip type |
| Drives Memjet ™ printheads directly | No print driver chips required, results in lower cost |
| Determines dot accurate ink usaege | Removes need for physical ink monitoring system in ink cartridges |

Figure 10:
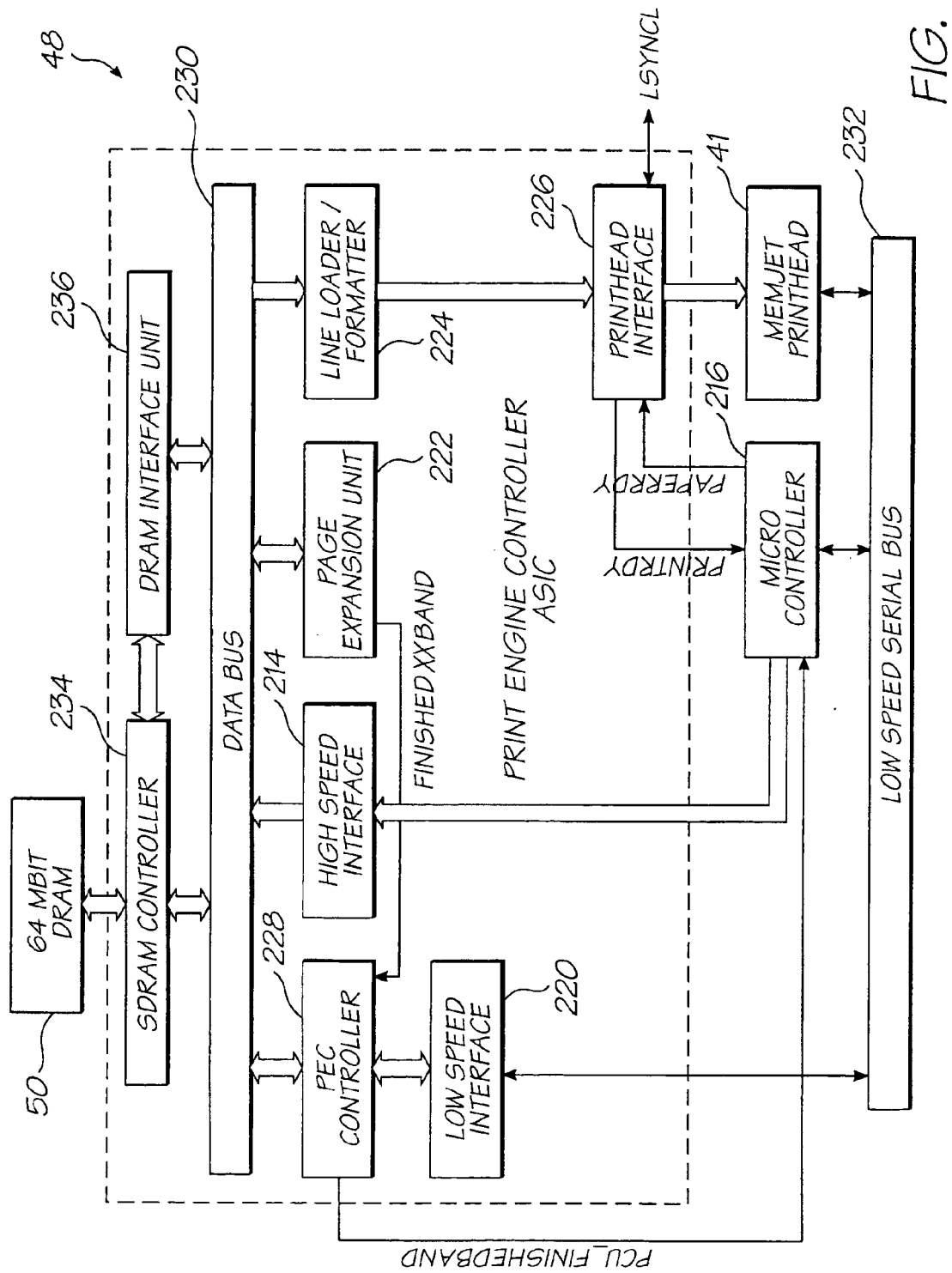
FIG. 10 shows a high-level block diagram of an image processing apparatus of the print assembly.

In FIG. 10, there is shown a block diagram of the PEC 48. The PEC 48 includes a micro controller interface in the form of a high-speed interface 214 through which an external micro controller 216 can write to the 64 Mbit DRAM chip 50. The high-speed interface 214 forms part of a data input means of the PEC 48.

The PEC 48 also includes a control circuitry interface in the form of a low speed serial interface 220 through which the micro controller 216 can access registers of the PEC 48 and the DRAM chip 50.

The PEC 48 also includes page expansion circuitry in the form of a page expansion unit (PEU) 222 that receives data relating to compressed pages and renders it into data relating to bi-level dots. Line loader and line formatter circuitry in the form of a line loader/formatter unit 224 is also provided that formats dots for a given print line destined for a printhead interface 226 that communicates directly with the printhead chips 186 of each printhead module 46.

As can be seen, the PEC 48 performs three basic tasks. These are:

a) Accepting register and DRAM access commands via the low speed interface 220 (or from the external DRAM chip 50).

b) Accepting DRAM write accesses (typically compressed page bands and register command blocks) via the high speed interface 214.

c) Rendering page bands from the external DRAM chip 50 to the printhead chips 186.

These tasks are independent. However, they do share the external DRAM chip 50. It follows that arbitration is required. The PEC 48 is configured so that DRAM accesses required for rendering page bands always have the highest priority.

The PEC 48 includes control circuitry in the form of a PEC controller 228 that provides external clients with the means to read and write PEC registers, and read and write DRAM in single 32 bit data chunks.

The DRAM chip 50 is connected to memory storage control circuitry in the form of an SDRAM controller 234. In turn, the SDRAM controller 234 is connected to memory storage control circuitry in the form of a DRAM interface unit 236.

The PEC 48 includes a data bus 230 and a low speed serial bus 232. Both the SDRAM controller 234 and the DRAM interface unit 236 are connected to the low speed serial bus 232. The PEC controller 228 is connected to the data-bus 230. The PEC controller 228 is also connected to the low speed serial bus 232 via the low speed interface 220. The high-speed interface 214, the PEU 222 and the line loader/formatter unit are also connected to the data bus 230.

In use, since the PEC 48 prints page bands from DRAM, a given band B is loaded into DRAM via the high-speed interface 214 before printing can begin. Then, while the PEC 48 is rendering band B via the PEU, band B+1 can be loaded to DRAM. While band B+1 is being expanded and printed, band B+2 can be loaded, and so on.

In the following table, the various components of the PEC 48 mentioned above are described briefly.

TABLE 2

Units within PEC (high level)

| unit acronym | unit name | reference numeral | description |
| --- | --- | --- | --- |
| DIU | DRAM interface unit | 236 | Provides the interface for DRAM read and write access for the various PEC units. The DIU provides arbitration between competing units and passes on DRAM requests to the SCU. |
| HSI | High speed interface | 214 | Provides external clients (such as the microcontroller) with the means to write to DRAM. |
| LLFU | Line loader formatter unit | 224 | Reads the expanded page image from line store, formatting the data appropriately for the Memjet printhead. |
| LSI | Low speed interface | 220 | Provides external clients with the means to send commands to the PCU and receive register reads. |
| PCU | PEC controller | 228 | Provides external clients with the means to read and write PEC registers, and read and write DRAM in single 32-bit chunks. |
| PEU | Page expansion unit | 222 | Reads compressed page data and writes out the decompressed form of the same to DRAM. |
| PHI | Printhead interface | 226 | Is responsible for sending dot data to the Memjet printhead segments and for providing line synchronization between multiple PECs. |
| SCU | SDRAM controller unit | 234 | Provides the DIU with access to the external DRAM. |

Figure 11:
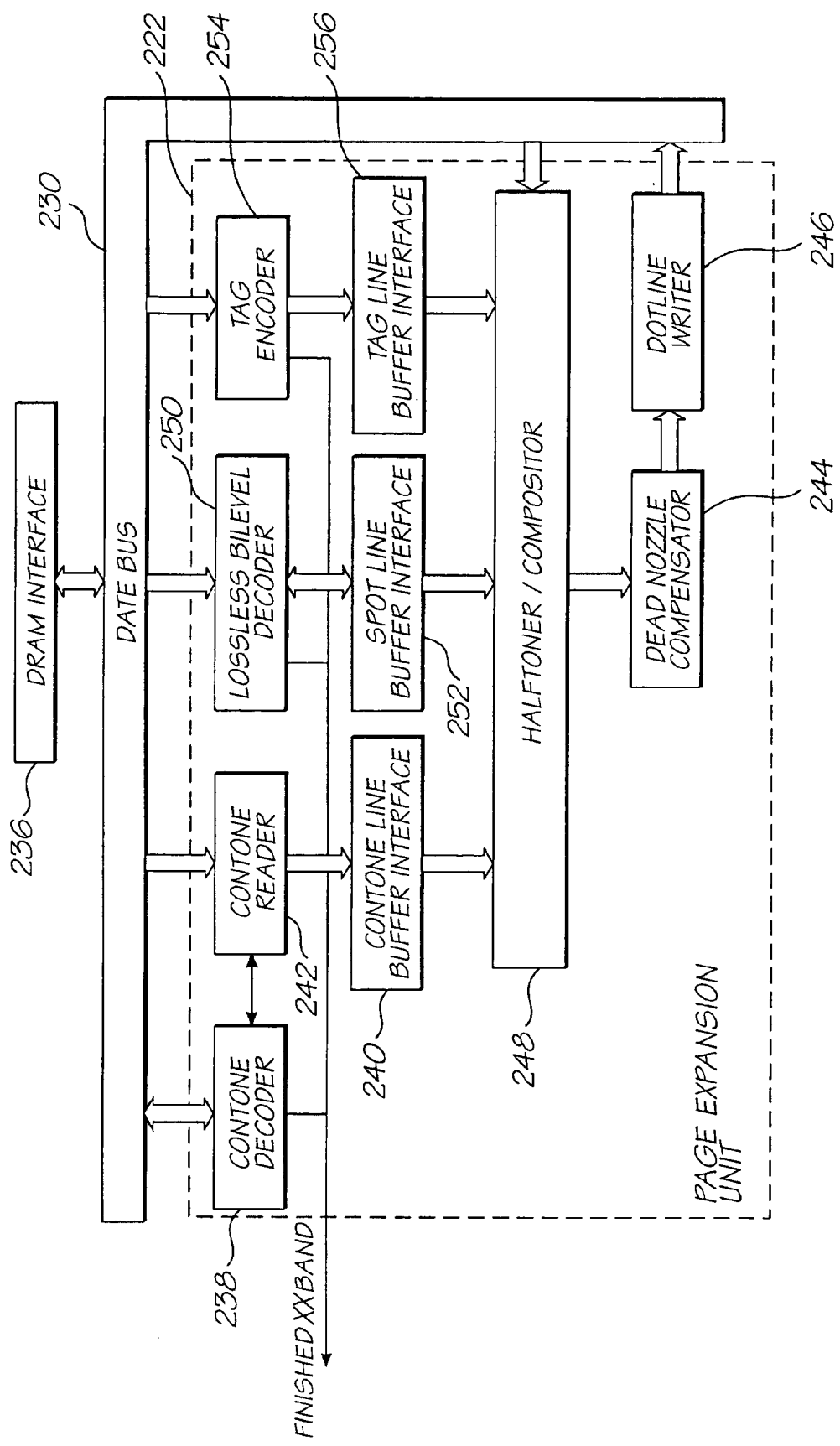
FIG. 11 shows an expanded block diagram of a page expansion unit of the image processing apparatus.

An expanded block diagram of the PEU 222 is shown in FIG. 11. In the following table, the various components of the PEU 222 are described briefly.

TABLE 3

Units within Page Expansion Unit (high level)

| unit acronym | unit name | reference numeral | description |
| --- | --- | --- | --- |
| CDU | Contone decoder unit | 238 | Expands JPEG compressed contone layer and writes decompressed contone to DRAM |
| CLBI | Contone line buffer interface | 240 | Provides line buffering between CRU and HCU |

TABLE 3-continued

Units within Page Expansion Unit (high level)

| unit acronym | unit name | reference numeral | description |
|---|---|---|---|
| CRU | Contone reader unit | 242 | Reads expanded contone image from DRAM |
| DNC | Dead nozzle compensator | 244 | Compensates for dead nozzles by error diffusing dead nozzle data into surrounding dots. |
| DWU | Dotline writer unit | 246 | Writes out the 6 channels of dot data for a given printline to the line store DRAM |
| HCU | Halftoner compositor unit | 248 | Dithers contone layer and composites the bi-level spot 0 and position tag dots. |
| LBD | Lossless bilevel decoder | 250 | Expands compressed bi-level layer. |
| SLBI | Spot line buffer interface | 252 | Provides line buffering between LBD and HCU |
| TE | Tag encoder | 254 | Encodes tag data into line of tag dots. |
| TLBI | Tag line buffer interface | 256 | Provides line buffering between TE and HCU |

A first stage in page expansion occurs along a pipeline defined by the CDU 238/CRU 242, the LBD 250 and the TE 254. The CDU 238 expands a JPEG-compressed contone (typically CMYK) layer. The LBD 250 expands a compressed bi-level layer (typically K), and the TE 254 encodes data tags for rendering (typically in IR or K ink) at a later stage. The CLBI 240, the SLBI 252 and the TLBI 256 receive output data from this stage.

The HCU 248 carries out a second stage. The HCU 248 dithers a contone layer and composites position tags and a bi-level spot0 layer over a resulting bi-level dithered layer. A data stream generated by the HCU 248 is adjusted to create smooth transitions across overlapping segments or printhead chips 186. The HCU 248 is configured so that a number of options exist for the way in which compositing occurs. This stage can produce up to six channels of bi-level data. It should be noted that not all six channels might be present on the printhead chips 186. For example, the printhead chips 186 may be CMY only, with K pushed into the CMY channels and IR ignored. Alternatively, the position tags mentioned above may be printed in K if IR ink is not available or for testing purposes.

The DNC 244 carries out a third stage. In this stage, the DNC 244 compensates for dead nozzles in the printhead chips 186 by error diffusing dead nozzle data into surrounding dots.

Bi-level, six channel dot-data (typically CMYK-IRF) generated in the above stages is buffered and written out to a set of line buffers stored in the off-chip DRAM via the DWU 246.

In a final stage, the dot-data is loaded back from the DRAM, formatted for the printhead, and passed to the printhead interface 226 via a dot FIFO (not shown). The dot FIFO accepts data from the line loader/formatter unit 224 at pclk rate, while the printhead interface 226 removes data from the FIFO and sends it to the printhead chips 186 at a rate of either pclk/4, pclk/2 or pclk.

Figure 12:
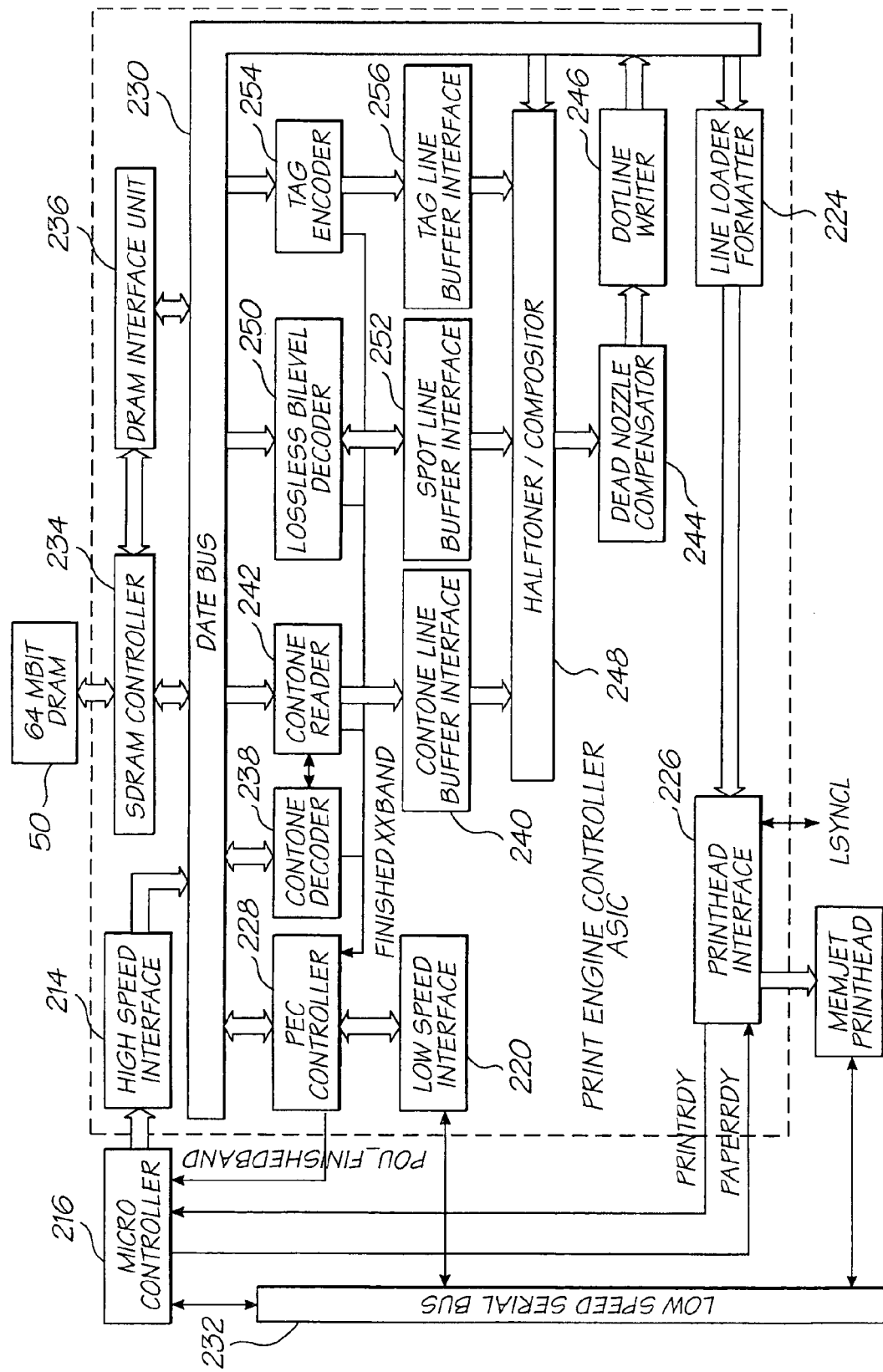
FIG. 12 shows a block diagram of the image processing apparatus incorporating the page expansion unit.

FIG. 12 simply shows the PEC 48 incorporating the exploded PEU 222.

The printing benefits associated with the printhead chips 186 are set out in detail in the above referenced applications and patents. However, some benefits are particularly important when applied to wide printing formats.

A particular benefit is the high number of nozzle arrangements 210 per printhead chip 186. This facilitates extremely rapid printing in that a single print cycle can achieve an image band. It follow that it is not necessary for further print cycles to be used to fill in "missing" dots as is the case with a scanning printhead.

The PEC's 48 provide the necessary synchronized control of the printhead chips 186 as described above. Furthermore, as is clear from a number of the above referenced applications and patents, for example U.S. Pat. No. 6,362,868, the printhead chips 186 allow for the conversion from analogue printing processes to fully digital processes. This allows for a substantial amount of flexibility and speed. Digital control of the printhead chips 186 is by means of the PEC's 48. The fact that the PEC's 48 digitally control the printhead chips 186 allows for the high printing speed of up to 21.6 billion drops per second. In particular, the need for separate printhead chip drivers is removed, which is key to the high printing speed of the chips 186.

The incorporation of the CMOS layer 190 serves to integrate CMOS technology with MEMS technology on each printhead chip 186. It follows that at least one off-chip connection for each nozzle arrangement 210 is not required. It will be appreciated that such a requirement would make a printhead unreliable and cost-prohibitive to manufacture.

A further important advantage associated with the printer 10 is that a width of the printing zone 120 is extremely small when compared to the length. In a particular example, the printing zone 120 can be as little as 0.5 mm thick. It will be appreciated that it is necessary to achieve extremely stable paper movement through the printing zone 120 in order to ensure that accurate printing takes place in the printing zone. The narrow width of the printing zone 120 facilitates minimal control over the paper 22 as it passes through the printing zone.

In the event that a substantially wider printing zone were provided, it would be necessary to provide further control over movement of the paper 22 through such a printing zone. This would require such devices as vacuum platens to retain the paper 22 against any form of pivotal or lateral movement as the paper 22 moves through the printing zone. This could greatly increase the cost of the wide format printer.

This highlights some reasons why thermal or bubble jet and piezoelectric printheads would not be practical choices when attempting to achieve the printing characteristics of the printer 10. As set out in the above referenced applications and patents, such printheads are not suitable for providing the high density of nozzle arrangements achieved with the printheads of the above referenced matters. It follows that, in attempting to apply thermal and piezoelectric printheads to a wide format printer, it would be necessary to have a relatively wide printing zone so that overlapping of printheads could occur to the necessary extent. This would immediately raise the problem mentioned above. Still further, especially with the thermal printheads, a suitable cooling system would be required to keep the temperature in the printing zone at a reasonable level. This would also increase the cost to an unacceptably high level.

In order to achieve an appreciation of the speed of the printer 10 at a resolution of 1600 dpi, the following comparative table is set out below. It should be noted that the purpose of the following table is simply to illustrate the speed of printing and is not intended to denigrate the various printers used for comparison.

print medium feed path that extends over an inner side of the second platen, the second primary roller, and an outer side of the first platen, the first and second primary rollers being configured to engage a length of print medium and to drive the print medium along the feed path on rotation of the primary rollers;

a support assembly that is mounted between the support members;

a printhead assembly that is positioned on the support assembly and that includes an array of printhead chips that are positioned to span the print area, each printhead chip incorporating a plurality of nozzle arrangements that are directed towards the first platen to carry out a printing operation on the print medium as it passes over the first platen; and

|  |  |  | Wide Format Printers |  |  |  |  |  |  |
|---|---|---|---|---|---|---|---|---|---|
| Memjet | OEM Printhead Print Width (inches) |  |  | 38.4 | 44.8 | 51.2 | 57.6 | 64.0 | 70.4 | 76.8 |
|  | Number of Printhead Chips |  |  | 48 | 56 | 64 | 72 | 80 | 88 | 96 |
|  | Number of Nozzles |  |  | 368,640 | 430,080 | 491,520 | 552,960 | 614,400 | 675,840 | 737,280 |
|  | Max. print speed (sq ft/hr at 1600 × 1600 dpi) |  |  | 17,578 | 20,508 | 23,438 | 26,367 | 29,297 | 32,227 | 35,156 |
|  | Make | Model | Resolution | Speed | Speed Advantage (# of times faster) | | | | | |
| Comparison | HP | 1000/5000 | 600 × 600 | 120 | 146 | 171 | 195 | 220 | 244 | 269 | 293 |
|  | HP | 3000/3500 | 600 × 300 | 72 | 244 | 285 | 326 | 366 | 407 | 448 | 488 |
|  | Epson | 7000/10000 | 720 × 720 | 90 | 195 | 228 | 260 | 293 | 326 | 358 | 391 |
|  | Encad | Novajet 800 | 600 × 600 | 96 | 183 | 214 | 244 | 275 | 305 | 336 | 366 |
|  | Gretag | Arizona | Draft mode | 444 | 40 | 46 | 53 | 59 | 66 | 73 | 79 |
|  | Gretag | Arizona | 309 × 618 | 220 | 80 | 93 | 107 | 120 | 133 | 146 | 160 |
|  | Colorspan | Mach X11 | 600 × 600 | 115 | 153 | 178 | 204 | 229 | 255 | 280 | 306 |
|  | Canon | BJW 9000 | 600 × 1200 | 72 | 244 | 285 | 326 | 366 | 407 | 448 | 488 |
|  | Mutoh | Albatross | 792 × 792 | 65 | 270 | 316 | 361 | 406 | 451 | 496 | 541 |
|  | Roland | HiFi Jet | 720 × 720 | 96 | 183 | 214 | 244 | 275 | 305 | 336 | 366 |
|  | Nur | Fresco | 360 × 360 | 300 | 59 | 68 | 78 | 88 | 98 | 107 | 117 |

As is known by those of skill in the fabrication of integrated circuits, while a set up cost for the manufacture of an integrated circuit device can be high, the cost of commercial manufacture of such devices is relatively low. It follows that Applicant envisages that the cost of manufacture of a wide format printer in accordance with this invention will be comparable to the cost of manufacture of the wide format printers listed in the above table.

It will be apparent to those skilled in the art that many obvious modifications and variations may be made to the embodiments described herein without departing from the spirit or scope of the invention.

We claim:

1. A printing mechanism that comprises a housing;

a pair of spaced support members that are positioned on either side of the housing;

first and second primary rollers that are mounted between the support members;

a first platen that is mounted between the support members and is positioned on one side of the rollers to define the print area;

a second platen that is mounted between the support members and is positioned on an opposite side of the rollers, the primary rollers and the platens defining a a cutting mechanism mounted between the support members, the cutting mechanism including a cutter that is displaceable with respect to the first platen to traverse the first platen thereby carrying out a cutting operation on the print medium.

2. A printing mechanism as claimed in claim 1, in which the primary rollers are rotatable to drive the length of print medium successively over the inner surface of the second platen, the second primary roller and the outer surface of the first platen.

3. A printing mechanism as claimed in claim 1, in which the support assembly includes a chassis and a channel member that is mounted on the chassis, the printhead assembly including an ink distribution structure that is positioned in a channel defined by the channel member and the array of printhead chips, which are positioned on the ink distribution structure.

4. A printing mechanism as claimed in claim 3, in which the chassis is displaceable towards and away from the first platen, the support assembly including a displacement mechanism that is operable to displace the chassis towards and away from the first platen.

5. A printing mechanism as claimed in claim 1, in which a brush member is mounted in the housing adjacent the second primary roller, the brush member having a profile that corresponds to the second primary roller such that the print medium feed path extends between the brush member and the second primary roller.

* * * * *

UNITED STATES PATENT AND TRADEMARK OFFICE
CERTIFICATE OF CORRECTION

PATENT NO. : 6,848,780 B2
DATED : February 1, 2005
INVENTOR(S) : Kia Silverbrook It is certified that error appears in the above-identified patent and that said Letters Patent is hereby corrected as shown below:

<u>Title page,</u>
Item [73], Assignee, should read -- Silverbrook Research Pty Ltd
Balmain (AU) --.

Signed and Sealed this

Twenty-third Day of August, 2005

JON W. DUDAS
*Director of the United States Patent and Trademark Office*